(12) United States Patent
Hasegawa et al.

(10) Patent No.: US 6,721,031 B2
(45) Date of Patent: Apr. 13, 2004

(54) EXPOSURE APPARATUS

(75) Inventors: Noriyasu Hasegawa, Tochigi (JP); Shigeru Terashima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/167,692

(22) Filed: Jun. 13, 2002

(65) Prior Publication Data

US 2002/0191163 A1 Dec. 19, 2002

(30) Foreign Application Priority Data

Jun. 15, 2001 (JP) ......................... 2001-182526

(51) Int. Cl.[7] ............... G03B 27/52; G03B 27/42; G03B 27/54
(52) U.S. Cl. ............... 355/30; 355/53; 355/55; 355/67
(58) Field of Search ............... 355/30, 53, 55, 355/67

(56) References Cited

U.S. PATENT DOCUMENTS

| 5,559,584 | A | * | 9/1996 | Miyaji et al. | 355/73 |
| 6,542,220 | B1 | * | 4/2003 | Schrijver et al. | 355/53 |
| 6,555,834 | B1 | * | 4/2003 | Loopstra | 250/492.3 |
| 2002/0000519 | A1 | | 1/2002 | Tsukamoto | |
| 2002/0018190 | A1 | | 2/2002 | Nogawa et al. | |
| 2002/0191166 | A1 | * | 12/2002 | Hasegawa et al. | 355/53 |

FOREIGN PATENT DOCUMENTS

| JP | 6-260385 | 9/1994 |
| JP | 11-111586 | 4/1999 |
| JP | 10-214782 | 8/1999 |
| JP | 2000-200745 | 7/2000 |
| JP | 2001-118783 | 4/2001 |
| JP | 2001-168027 | 6/2001 |
| JP | 2001-250759 | 9/2001 |
| JP | 2001-284224 | 10/2001 |
| JP | 2001-297972 | 10/2001 |
| JP | 2001-358056 | 12/2001 |

* cited by examiner

*Primary Examiner*—Rodney Fuller
(74) *Attorney, Agent, or Firm*—Fitzpatrick, Cella, Harper & Scinto

(57) ABSTRACT

This invention shortens a time required to purge, with inert gas, gas in a space (optical path space) through which exposure light passes, such as a space between a projection optical system and a substrate. The exposure apparatus includes a wafer stage (102), a projection optical system (101), and an air supply portion (112) which supplies inert gas at a nonuniform flow velocity to an optical path space (113) through which exposure light passes between the wafer stage (102) and the projection optical system (101). A downward flow of inert gas is formed.

41 Claims, 32 Drawing Sheets

EXPOSURE APPARATUS

FIELD OF THE INVENTION

The present invention relates to an exposure apparatus suitable for manufacturing a semiconductor element, image sensing element, liquid crystal display element, thin-film magnetic head, and any other microdevices.

BACKGROUND OF THE INVENTION

Photolithography for manufacturing a semiconductor element or the like adopts an exposure apparatus which exposes a photosensitive substrate to the pattern image of a mask (e.g., reticle) via a projection optical system. Recently, semiconductor integrated circuits have been developed toward micropatterning, and the wavelength of a photolithography light source is being decreased in photolithography.

Such an exposure apparatus suffers a decrease in the intensity of exposure light under the influence of absorption of exposure light by oxygen in the use of, as exposure light, vacuum ultraviolet rays, particularly, light with a wavelength shorter than 250 nm such as a KrF excimer laser beam (wavelength: 248 nm), an ArF excimer laser beam (wavelength: 193 nm), or an $F_2$ laser beam (wavelength: 157 nm), harmonic light such as a YAG laser beam, or X-rays.

The prior art avoids a decrease in the transmittance of light as follows: a closed space which confines only an optical path is formed in an exposure apparatus having a light source such as an $F_2$ excimer laser, and gas in the closed space is purged with gas such as nitrogen not containing oxygen.

FIG. 32 is a view showing an exposure apparatus which executes exposure by supplying inert gas into a space defined by an optical member on the final stage of a projection optical system (lens barrel) and a photosensitive substrate (wafer) and forming an inert gas atmosphere in the space. In this exposure apparatus, a shielding member is arranged around the space in order to separate the space in the exposure region from an ambient atmosphere. Inert gas is supplied from the vicinity of the exposure region to the space.

The exposure apparatus shown in FIG. 32 requires several sec until the oxygen concentration in the space in the exposure region decreases after a wafer stage is driven to load a wafer into the exposure region. This results in low throughput.

The same problem occurs when inert gas is supplied to the vicinity of a reticle. Also for the reticle, the exposure apparatus requires several sec until the oxygen concentration in a space surrounded by a shielding member decreases, which decreases the throughput.

SUMMARY OF THE INVENTION

The present invention has been made in consideration of the above situation, and has as its object to shorten a time required to purge, with inert gas, gas in an optical path space including a space (exposure region) through which exposure light passes, such as a space between a projection optical system and a substrate, a space between an illumination optical system which illuminates a mask (e.g., reticle) and a mask stage which holds the mask, and a space between the mask stage and the projection optical system, and/or to maintain the purity or concentration of inert gas in the optical path space at a proper level.

To achieve the above object, according to the present invention, there is provided an exposure apparatus which projects and transfers a pattern formed on a mask to a substrate by using exposure light, comprising a stage, an optical system, and a gas flow formation mechanism which forms a flow of inert gas in an optical path space including a space through which exposure light passes between the stage and the optical system, wherein the gas flow formation mechanism forms a flow of inert gas having a spatially or temporally nonuniform distribution in the optical path space. This arrangement can shorten a time required to purge gas in an optical path space with inert gas, and/or maintain the purity or concentration of inert gas in the optical path space at a proper level.

According to a preferred aspect of the present invention, the gas flow formation mechanism forms a flow of inert gas having a nonuniform flow velocity distribution in the optical path space, as a flow of inert gas having a spatially nonuniform distribution.

More specifically, it is preferable that the gas flow formation mechanism comprise a supply mechanism which supplies inert gas to the optical path space, and that the supply mechanism supply inert gas having a nonuniform flow velocity distribution to the optical path space.

Alternatively, it is preferable that the gas flow formation mechanism comprise a supply mechanism which supplies inert gas to the optical path space, and an exhaust mechanism which exhausts gas containing inert gas from the optical path space, and that the exhaust mechanism exhaust the gas containing the inert gas from the optical path space so as to form a nonuniform flow velocity distribution in the optical path space.

According to another preferred aspect of the present invention, the nonuniform flow velocity distribution preferably includes a distribution in which a flow velocity is higher at a portion closer to the optical system. The flow of inert gas can be formed in a direction apart from the optical system, and gas in the optical path space can be efficiently exhausted.

Alternatively, according to still another preferred aspect of the present invention, the nonuniform flow velocity distribution preferably includes a distribution in which a flow velocity is higher at a portion closer to an optical axis of the optical system. The flow of inert gas can be formed from the optical path space toward an ambient space, and gas in the optical path space can be efficiently exhausted.

According to still another preferred aspect of the present invention, the supply mechanism preferably comprises two gas supply portions arranged at positions opposite to each other via the optical path space. This can further increase the exhaust efficiency.

As means for forming a flow of inert gas having a temporally nonuniform distribution, e.g., a flow of inert gas whose flow velocity temporally changes, according to still another preferred aspect of the present invention, the gas flow formation mechanism comprises a supply mechanism which supplies inert gas to the optical path space, and the supply mechanism changes a flow rate of inert gas supplied to the optical path space along with a lapse of time. Since gas in the optical path space can be stirred, the purge time can be shortened.

According to still another preferred aspect of the present invention, it is preferable that the gas flow formation mechanism comprise two gas supply portions arranged at positions opposite to each other via the optical path space, and that inert gas be supplied to the optical path space to make a flow of gas in the optical path space nonuniform.

The two gas supply portions preferably supply different supply amounts of inert gas to the optical path space or to change flow rates of inert gas along with a lapse of time. This can enhance the stirring effect.

It is more preferable that the gas flow formation mechanism comprise at least two supply mechanisms which supply inert gas to the optical path space, and that the at least two supply mechanisms be controlled to supply different supply amounts of inert gas from the respective supply mechanisms or to change flow rates of inert gas supplied from the respective supply mechanisms along with a lapse of time. This can further enhance the stirring effect.

The at least two supply mechanisms are controlled to change flow rates of inert gas supplied from the respective supply mechanisms to the optical path space along with a lapse of time while a sum of the flow rates of inert gas supplied from the respective supply mechanisms to the optical path space is kept almost constant. The stirring effect can be enhanced while the consumption amount of inert gas is kept constant.

The gas flow formation mechanism preferably changes a flow of inert gas formed in the optical path space in accordance with a change in positional relationship between the stage and the optical path space. Alternatively, it is preferable that the gas flow formation mechanism comprise a supply mechanism which supplies inert gas to the optical path space, and an exhaust mechanism which exhausts gas containing inert gas from the optical path space, and that the supply mechanism and the exhaust mechanism change a supply amount and an exhaust amount in accordance with a change in positional relationship between the stage and the optical path space. The exhaust (purging) efficiency can be improved while reducing the amount of necessary inert gas.

More specifically, the gas flow formation mechanism preferably evacuates the optical path space by a predetermined exhaust amount when a predetermined region of the stage starts to enter the optical path space, and decreases the exhaust amount after the predetermined region of the stage completely enters the optical path space.

Alternatively, the gas flow formation mechanism preferably evacuates the optical path space by a predetermined exhaust amount when a predetermined region of the stage starts to enter the optical path space, and stops exhaust after the predetermined region of the stage completely enters the optical path space.

Alternatively, it is preferable that the gas flow formation mechanism comprise a supply mechanism which supplies inert gas to the optical path space, and a supply/exhaust mechanism which supplies inert gas to the optical path space or exhausts gas containing inert gas from the optical path space, and that the gas flow formation mechanism cause the supply mechanism to supply inert gas to the optical path space and operate the supply/exhaust mechanism as an exhaust mechanism when a predetermined region of the stage starts to enter the optical path space, and operate the supply/exhaust mechanism as an air supply mechanism after a lapse of predetermined time.

According to still another preferred aspect of the present invention, the gas flow formation mechanism comprises a plurality of flow rate controllers, and a plurality of air supply ports respectively connected to the plurality of flow rate controllers, and the plurality of flow rate controllers form a nonuniform flow velocity distribution.

Alternatively, the gas flow formation mechanism may form a nonuniform flow velocity distribution by the plurality of flow rate controllers using a plurality of filters having different pressure losses.

According to still another preferred aspect of the present invention, the exposure apparatus preferably further comprises a shielding portion which separates at least part of a side plane of the optical path space from an ambient space around the optical path space. This arrangement makes it easy to increase the purge efficiency in the optical path space and maintain the purity or concentration of inert gas in the optical path space at a proper level.

The exposure apparatus preferably further comprises a shielding portion which separates a plane having no gas flow formation mechanism out of side planes of the optical path space from an ambient space around the optical path space.

According to still another preferred aspect of the present invention, the nonuniform flow velocity distribution preferably includes a distribution in which a flow velocity is higher at a periphery apart from an optical axis of the optical system. For example, entrance of an ambient atmosphere from an ambient space to the optical path space can be suppressed upon the completion of purge, and the purity or concentration of inert gas in the optical path space can be maintained at an appropriate level.

According to still another preferred aspect of the present invention, it is preferable that the gas flow formation mechanism comprise a plurality of flow rate controllers, and a plurality of air supply ports respectively connected to the plurality of flow rate controllers, and that the plurality of flow rate controllers form a nonuniform flow velocity distribution.

Alternatively, it is preferable that the gas flow formation mechanism comprise a plurality of air supply ports arranged to supply inert gas in a predetermined direction, and that an outer air supply port out of the plurality of air supply ports project in the predetermined direction.

According to still another preferred aspect of the present invention, it is preferable that the gas flow formation mechanism comprise a supply mechanism which supplies inert gas to the optical path space, and an exhaust mechanism which exhausts gas containing inert gas from the optical path space, and that the exhaust mechanism be arranged at a position opposite to the supply mechanism via the optical path space.

Alternatively, according to still another preferred aspect of the present invention, the gas flow formation mechanism preferably comprises two gas supply portions arranged at positions opposite to each other via the optical path space. In this case, the gas flow formation mechanism preferably comprises two gas exhaust portions arranged at positions opposite to each other via the optical path space.

According to still another preferred aspect of the present invention, the exposure apparatus preferably further comprises a wall arranged at a position opposite to the supply mechanism via a center of the optical path space with a surface of the wall facing to the center.

According to still another preferred aspect of the present invention, the exposure apparatus preferably further comprises a shielding portion which separates at least part of a side plane of the optical path space from an ambient space around the optical path space. This arrangement can further suppress entrance of an ambient atmosphere from an ambient space to the optical path space. The exposure apparatus preferably further comprises a shielding portion which separates a plane having no gas flow formation mechanism out of side planes of the optical path space from an ambient space around the optical path space. The shielding portion may be formed by a flow of inert gas.

According to still another preferred aspect of the present invention, the gas flow formation mechanism preferably supplies inert gas to the optical path space so as to adjust the optical path space to a positive pressure with respect to an ambient space.

According to still another preferred aspect of the present invention, at least part of the shielding portion is preferably formed from a member which transmits alignment light.

According to still another preferred aspect of the present invention, the exposure apparatus preferably further comprises a substrate stage, a substrate chuck mounted on the substrate stage, and a member which smooths a change in level between a substrate chucked by the substrate chuck and an ambient portion.

According to still another preferred aspect of the present invention, the shielding portion which defines the optical path space preferably changes a length to the photosensitive substrate, thereby increasing the exhaust efficiency in the optical path space.

According to still another preferred aspect of the present invention, the gas flow formation mechanism is arranged to form a flow of inert gas in, e.g., an optical path space between a projection optical system and the substrate.

According to still another preferred aspect of the present invention, the gas flow formation mechanism is arranged to form a flow of inert gas in, e.g., an optical path space between an illumination system which illuminates the mask and a mask stage which holds the mask.

According to still another preferred aspect of the present invention, the gas flow formation mechanism is arranged to form a flow of inert gas in, e.g., an optical path space between a mask stage which holds the mask and a projection optical system.

According to still another preferred aspect of the present invention, the gas flow formation mechanism preferably comprises a first gas flow formation mechanism arranged to form a flow of inert gas in a first optical path space between a projection optical system and the substrate, a second gas flow formation mechanism arranged to form a flow of inert gas in a second optical path space between an illumination system which illuminates the mask and a mask stage which holds the mask, and a third gas flow formation mechanism arranged to form a flow of inert gas in a third optical path space between the mask stage and the projection optical system.

According to still another preferred aspect of the present invention, the inert gas includes nitrogen gas or helium gas.

A device manufacturing method according to the present invention comprises the steps of transferring a pattern to a substrate coated with a photosensitive material by using the above-described exposure apparatus, and developing the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below with reference to the accompanying drawings.

[First Embodiment]

Figure 1:
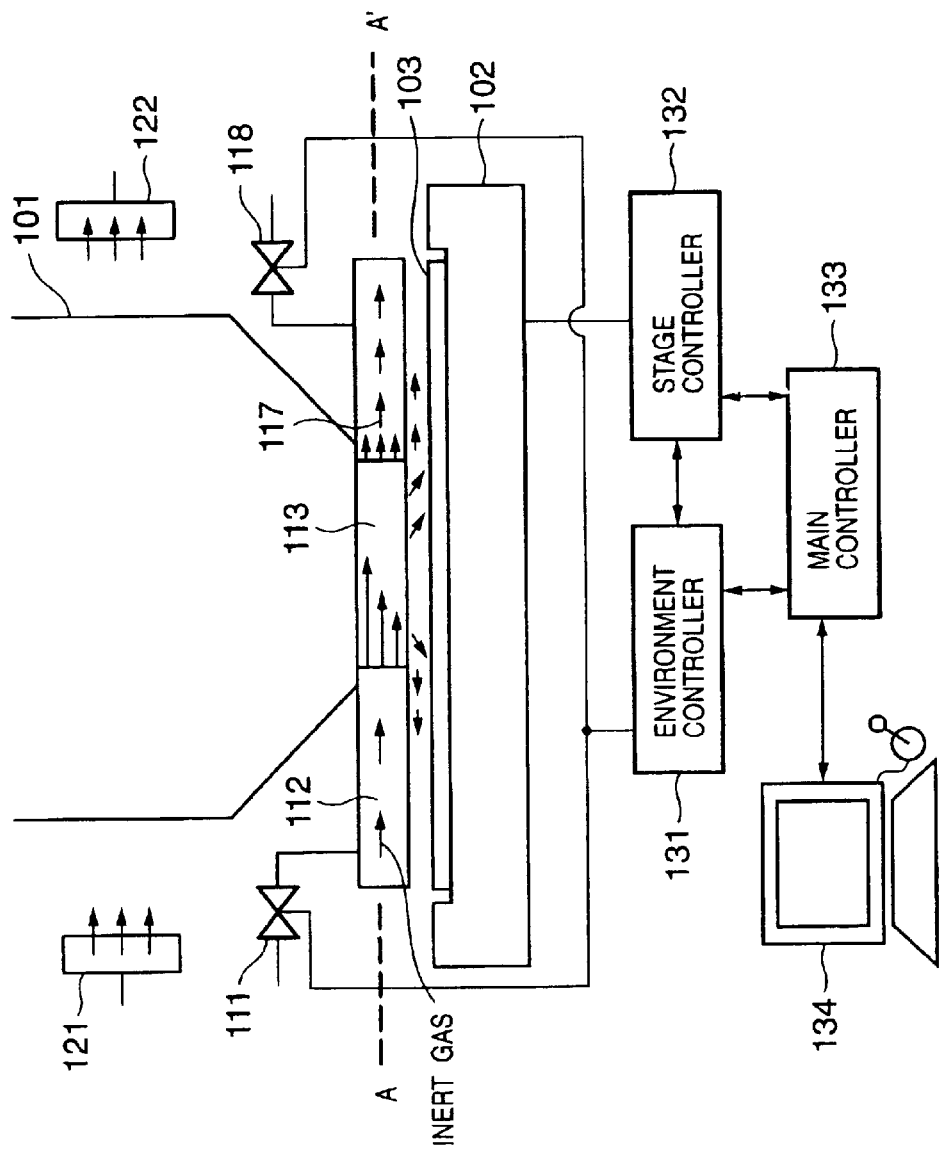
FIG. 1 is a view showing part of an exposure apparatus according to the first embodiment of the present invention.
Figure 2:
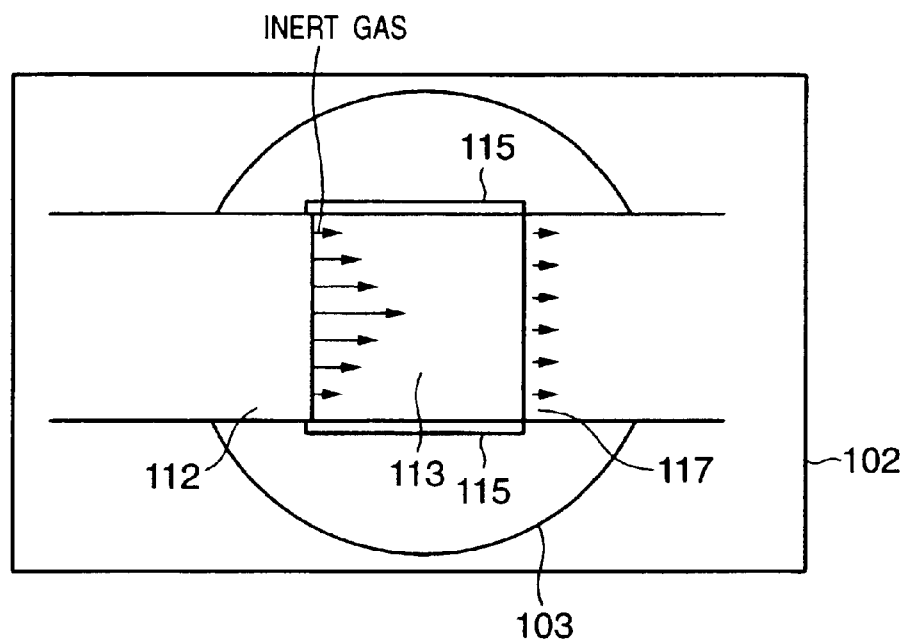
FIG. 2 is a plan view when viewed downward from the line A–A' in FIG. 1.

FIGS. 1 and 2 are views showing part of an exposure apparatus according to the first embodiment of the present invention. FIG. 1 is a schematic view showing the lower part of the projection optical system (lens barrel) of the exposure apparatus, the vicinity of a wafer, and a control system. FIG. 2 is a plan view when viewed downward from the line A–A' in FIG. 1.

The exposure apparatus comprises a light source (not shown) such as an $F_2$ excimer laser which generates a short-wavelength laser beam as illumination light. Illumination light (exposure light) generated by the light source uniformly illuminates a reticle (mask) via a proper illumination optical member. Light (exposure light) having passed through the reticle reaches the surface of a wafer 103 set on a wafer stage 102 via various optical members which constitute a projection optical system 101. The light forms the reticle pattern image on the surface of the wafer 103.

The wafer stage 102 which supports the wafer 103 is movable three-dimensionally (X, Y, and Z directions). The reticle pattern is sequentially projected and transferred onto the wafer 103 by a so-called step & repeat method of repeating stepping movement and exposure. This arrangement is almost the same when the present invention is applied to a scanning exposure apparatus.

In exposure, temperature-controlled inert gas (e.g., nitrogen gas or helium gas) is supplied via a air supply valve 111 and air supply portion (supply portion) 112 to a space (to be referred to as an optical path space hereinafter) 113 including a space through which exposure light passes and its vicinity between the wafer 103 and an optical member (to be referred to as a final optical member hereinafter) on the final stage of the projection optical system 101. Part of inert gas supplied to the optical path space 113 is recovered at an exhaust portion 117 and exhausted via an exhaust valve 118. The air supply valve 111, air supply portion 112, exhaust portion 117, and exhaust valve 118 constitute an example of a gas flow formation mechanism of forming the flow of gas such as inert gas in the optical path space 113. Note that arrows in FIGS. 1 and 2 indicate flows of inert gas, the directions of the arrows indicate flow directions of inert gas, and the lengths of the arrows represent flow amounts of inert gas.

Two side planes of the optical path space 113 between the final optical member of the projection optical system 101 and the wafer 103 are separated from an ambient space by shielding members 115. The air supply portion 112 and exhaust portion 117 are coupled on the remaining two side planes of the optical path space. At least part of the shielding member 115 is made of a transparent member in order to transmit alignment light. Gas controlled to a predetermined temperature is supplied outside the optical path space 113 from the second air supply portion 121 for controlling the temperature of the stage 102, and is recovered and exhausted through the second exhaust portion 122.

To adjust the optical path space 113 to a positive pressure with respect to an ambient atmosphere, the amount of inert gas recovered by the exhaust portion 117 is set smaller than that of inert gas supplied from the air supply portion 112. Inert gas which leaks to the ambient space via a gap between the wafer 103 and the shielding member 115 below the projection optical system 101 is recovered and exhausted by a second exhaust portion 122 together with an ambient atmosphere supplied from a second air supply portion 121.

Opening/closing of the valves 111 and 118 and their opening degrees are controlled by an environment controller 131, whereas the stage 102 is controlled by a stage controller 132. The controllers 131 and 132 and other controllers (not shown) are comprehensively controlled by a main controller 133 in various operations such as wafer exchange, alignment operation, and exposure operation. The control contents of the main controller 133 and the operation state of the exposure apparatus are monitored by a monitoring device 134.

In wafer exchange, the oxygen concentration in the optical path space 113 greatly increases under the influence of the ambient atmosphere. If the wafer stage 102 which holds the wafer 103 enters the optical path space 113 in this state, the exhaust efficiency of gas from the optical path space 113 decreases. Decreasing the oxygen concentration in the optical path space 113 requires several sec, which leads to low throughput. The exhaust efficiency is low near the projection optical system 101 in the optical path space 113.

Considering this, the first embodiment supplies inert gas at a higher speed at a portion closer to the final optical member of the projection optical system 101 and a portion closer to the center of exposure (optical axis). The inert gas expels gas remaining in the optical path space 113 to the outside. By flowing inert gas with this flow velocity distribution, a flow from the upside to the downside (i.e., flow toward an opening) can be formed in the optical path space 113 to shorten the purge time in wafer exchange.

As a method of giving a desired flow velocity distribution to the flow of inert gas, for example, the air supply portion 112 is made up of a plurality of air supply nozzles, and the respective air supply nozzles are equipped with separate flow rate controllers. Alternatively, a plurality of filters with different pressure losses are inserted in the flow path of the air supply portion 112.

When the first embodiment is applied to a scanning exposure apparatus, the supply direction of inert gas by the air supply portion 112 is made parallel to the scanning direction (moving direction) of the wafer stage 102. The concentration distribution of inert gas perpendicular to the scanning direction can be made uniform.

In the first embodiment, the amount of inert gas supplied from the air supply portion 112 is larger at a portion closer to the final optical member and smaller at a portion closer to the wafer. However, the present invention is not limited to this setting. For example, a plurality of nozzles of the air supply portion 112 may be classified into two groups: a group (the number of nozzles belonging to this group may be one) closer to the final optical member and a group (the number of nozzles belonging to this group may be one) closer to the wafer. In this case, the supply amount of inert gas from the nozzles of the group closer to the final optical member is adjusted larger than that of inert gas from the nozzles of the group closer to the wafer. Alternatively, a plurality of nozzles may be classified into three groups from a side closer to the final optical member, and the supply amount of inert gas from a group closer to the final optical member may be set larger while the supply amounts of inert gas from the nozzles of each group are the same. The number of nozzle groups can be arbitrarily set.

Alternatively, the supply amount of inert gas from the air supply portion 112 may be kept substantially constant, and the exhaust amount of inert gas from the exhaust portion 117 may be decreased at a portion closer to the final optical member. As a method of decreasing the exhaust amount, a plurality of nozzles may be classified into a plurality of groups, as described above, and the gas exhaust amount may be changed between the groups. Alternatively, the gas exhaust amount may be adjusted for each nozzle.

[Second Embodiment]

The first embodiment shortens the purge time by changing the flow velocity distribution of inert gas supplied from the air supply portion 112. In addition to this, the second embodiment shortens the purge time by changing the flow velocity distribution of inert gas exhausted from the exhaust portion 117.

Figure 3:
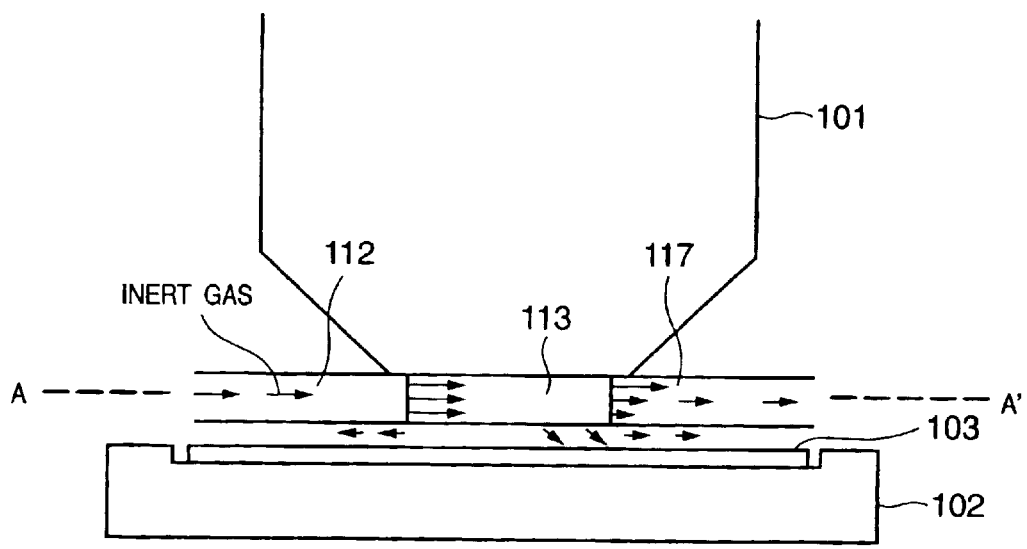
FIG. 3 is a view showing part of an exposure apparatus according to the second embodiment of the present invention.
Figure 4:
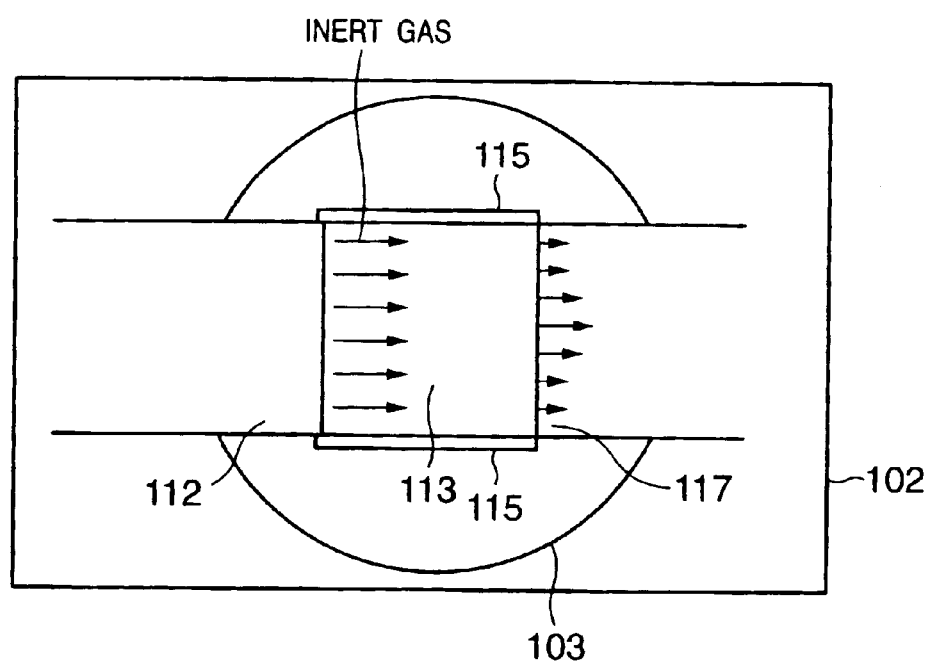
FIG. 4 is a plan view when viewed downward from the line A–A' in FIG. 3.

FIGS. 3 and 4 are views showing part of an exposure apparatus according to the second embodiment of the present invention. FIG. 3 is a schematic view showing the lower part of the projection optical system (lens barrel) of the exposure apparatus and the vicinity of a wafer. FIG. 4 is a plan view when viewed downward from the line A–A' in FIG. 3. FIG. 3 does not illustrate building components 131 to 134 in FIG. 1 for descriptive convenience.

As described above, the exhaust efficiency is low near a projection optical system 101 in an optical path space 113. In the second embodiment, inert gas is supplied at a higher speed at a portion closer to the final optical member of the projection optical system 101 and a portion closer to the center of exposure (optical axis). As a result, the exhaust efficiency of gas remaining in the optical path space 113 increases to shorten the purge time. The exhaust amount must be smaller than the supply amount in order to maintain a positive pressure in the optical path space 113.

As a method of giving a desired flow velocity distribution to the flow of inert gas, for example, an exhaust portion 117 is made up of a plurality of exhaust nozzles, and each exhaust nozzle is equipped with a flow rate controller. Alternatively, a plurality of filters with different pressure losses are inserted in the flow path of the exhaust portion 117.

When the second embodiment is applied to a scanning exposure apparatus, the exhaust direction of inert gas by the exhaust portion 117 is made parallel to the scanning direction (moving direction) of a wafer stage 102. The concentration distribution of inert gas perpendicular to the scanning direction can be made uniform.

[Third Embodiment]

Figure 5:
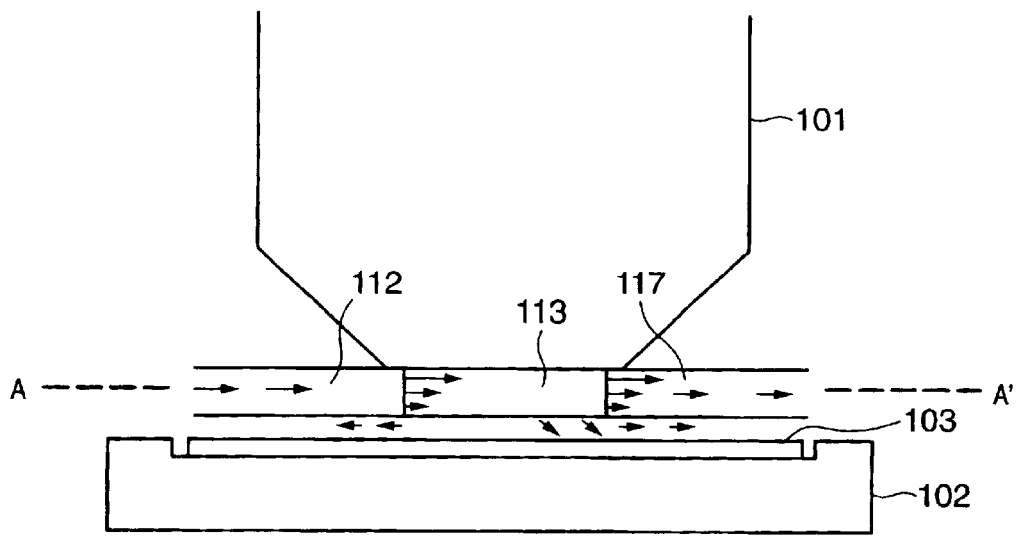
FIG. 5 is a view showing part of an exposure apparatus according to the third embodiment of the present invention.
Figure 6:
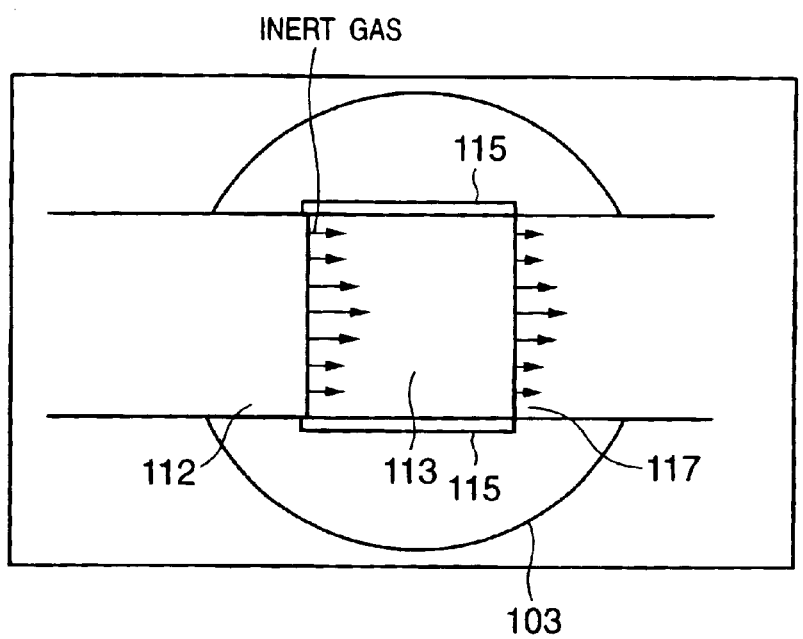
FIG. 6 is a plan view when viewed downward from the line A–A' in FIG. 5.

FIGS. 5 and 6 are views showing part of an exposure apparatus according to the third embodiment of the present invention. FIG. 5 is a schematic view showing the lower part of the projection optical system (lens barrel) of the exposure apparatus and the vicinity of a wafer. FIG. 6 is a plan view when viewed downward from the line A–A' in FIG. 5. FIG. 5 does not illustrate building components 131 to 134 in FIG. 1 for descriptive convenience.

The third embodiment is a combination of the first and second embodiments. The third embodiment can effectively purge gas in the optical path space with inert gas.

Also in this embodiment, the exhaust amount must be smaller than the supply amount in order to maintain a positive pressure in an optical path space 113. The distribution of the atmosphere in the optical path space 113 is desirably uniform at a ppm-level oxygen concentration. For this purpose, the exhaust amount by an exhaust portion 117 must be suppressed very little. In addition, the following items must be taken into consideration. Supply of inert gas from only one direction may form a nonuniform concentration distribution depending on the supply amount. When an ambient atmosphere is involved in the optical path space 113 due to movement of a wafer stage 102 or the like, a nonuniform concentration distribution depending on the moving direction may be formed.

Figure 7:
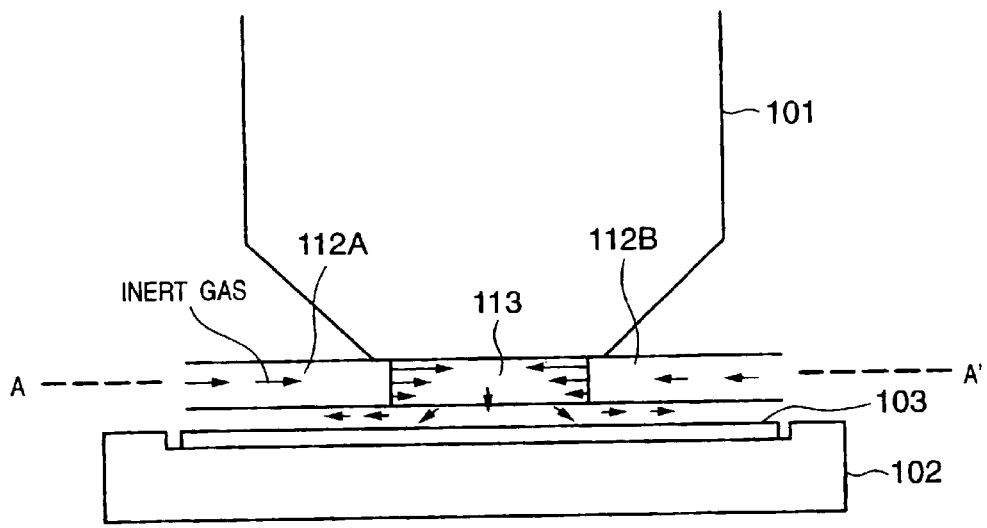
FIG. 7 is a view showing part of an exposure apparatus according to a modification of the third embodiment of the present invention.
Figure 8:
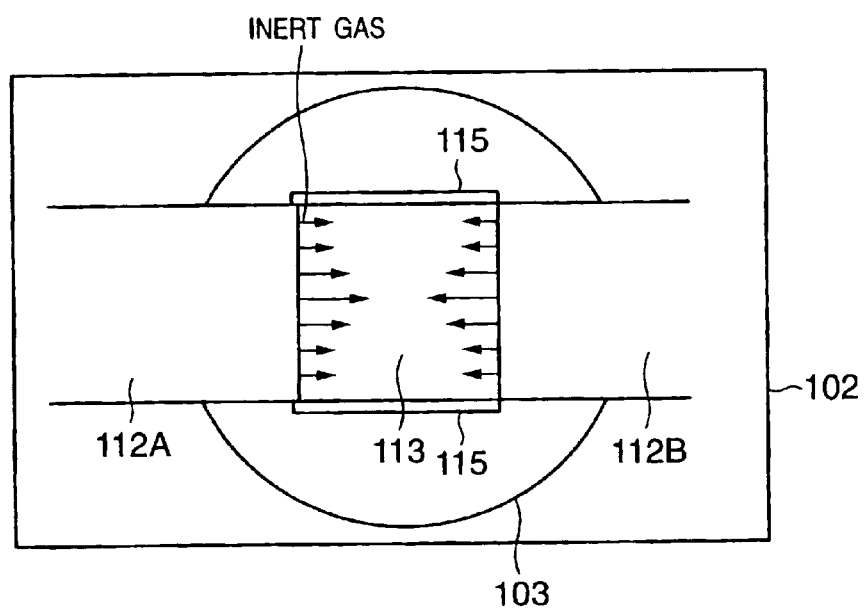
FIG. 8 is a plan view when viewed downward from the line A–A' in FIG. 7.

FIGS. 7 and 8 are views showing part of an exposure apparatus according to a modification of the third embodiment of the present invention. FIG. 7 is a schematic view showing the lower part of the projection optical system (lens barrel) of the exposure apparatus and the vicinity of a wafer. FIG. 8 is a plan view when viewed downward from the line A–A' in FIG. 7. FIG. 7 does not illustrate building components 131 to 134 in FIG. 1 for descriptive convenience.

In this modification, two facing air supply portions 112A and 112B are arranged, and inert gas is supplied from the two air supply portions 112A and 112B to the optical path space 113. This arrangement can solve the above-mentioned problem and shorten the purge time.

When the third embodiment and its modification are applied to a scanning exposure apparatus, the supply direction of inert gas by the air supply portion 112 (112A and 112B) is made parallel to the scanning direction (moving direction) of a wafer stage 102. The concentration distribution of inert gas perpendicular to the scanning direction can be made uniform.

[Fourth Embodiment]

Figure 9:
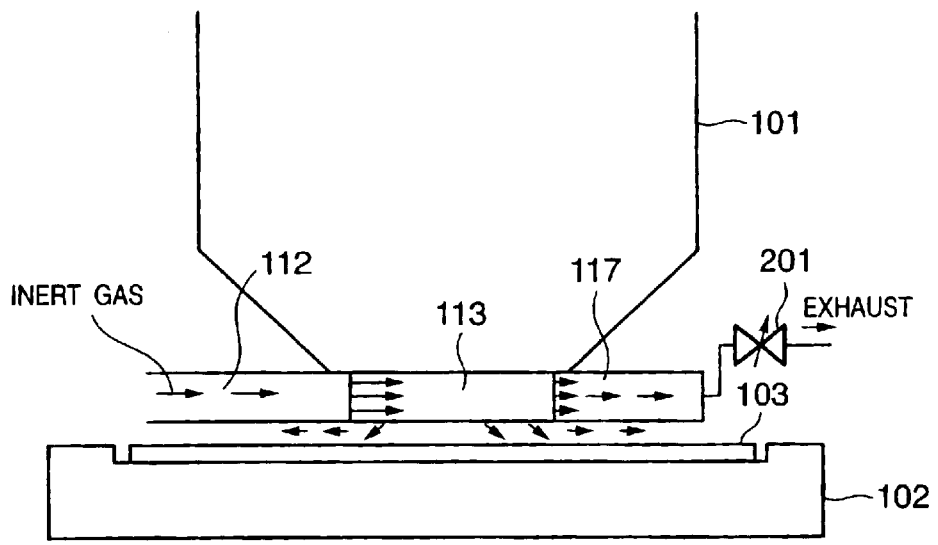
FIG. 9 is a view showing part of an exposure apparatus according to an improvement of the fourth embodiment of the present invention.
Figure 10:
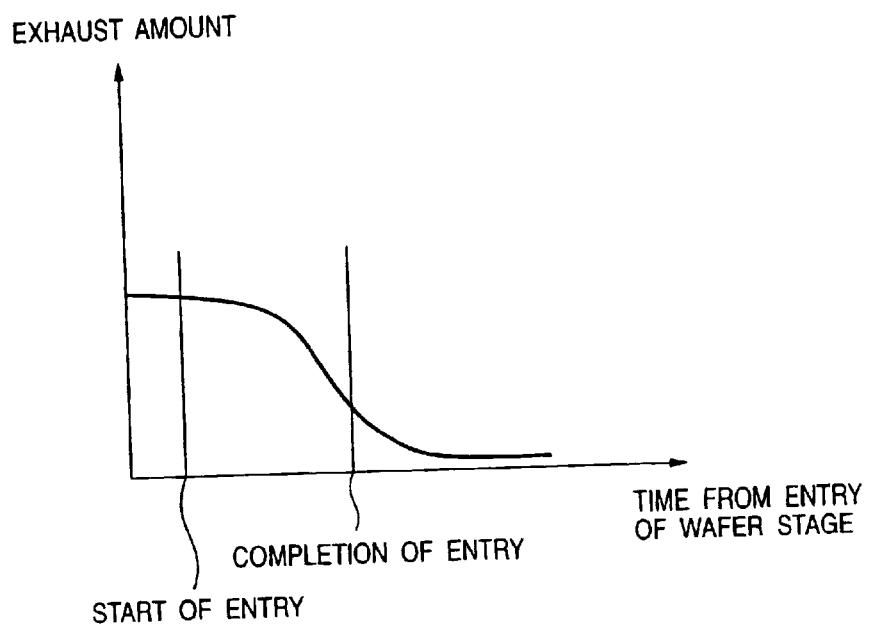
FIG. 10 is a graph showing control of the exhaust amount in the fourth embodiment of the present invention.

FIG. 9 is a schematic view showing the lower part of the projection optical system (lens barrel) of an exposure apparatus and the vicinity of a wafer according to the fourth embodiment of the present invention. FIG. 9 does not illustrate building components 131 to 134 in FIG. 1 for descriptive convenience. FIG. 10 is a graph showing control of the exhaust amount in the fourth embodiment.

The purge time must be shortened only during wafer exchange, and during other operations, the inert gas concentration suffices to be kept high within an optical path space 113. In the fourth embodiment, a flow rate adjustment valve 201 is connected to an exhaust portion 117. As shown in FIG. 10, the flow rate adjustment valve 201 allows exhausting gas at an exhaust speed enough to maintain the optical path space 113 at a positive pressure until a wafer stage 102 completely moves below the optical path space 113 after wafer exchange, and decreasing the exhaust amount after the wafer stage 102 moves below the optical path space 113. This control can suppress the consumption amount of inert gas while shortening the purge time. The flow rate adjustment valve 201 is controlled by an environment controller (corresponding to the environment controller 131 in FIG. 1).

Alternatively, the flow rate adjustment valve 201 may be ON/OFF-controlled such that gas is exhausted at an exhaust speed enough to maintain the optical path space 113 at a positive pressure until the wafer stage 102 completely moves below the optical path space 113 after wafer exchange, and that the exhaust is stopped after the wafer stage 102 moves below the optical path space 113. In this case, almost the same effects as those of control shown in FIG. 10 can be obtained though exhaust control is simplified.

Figure 11:
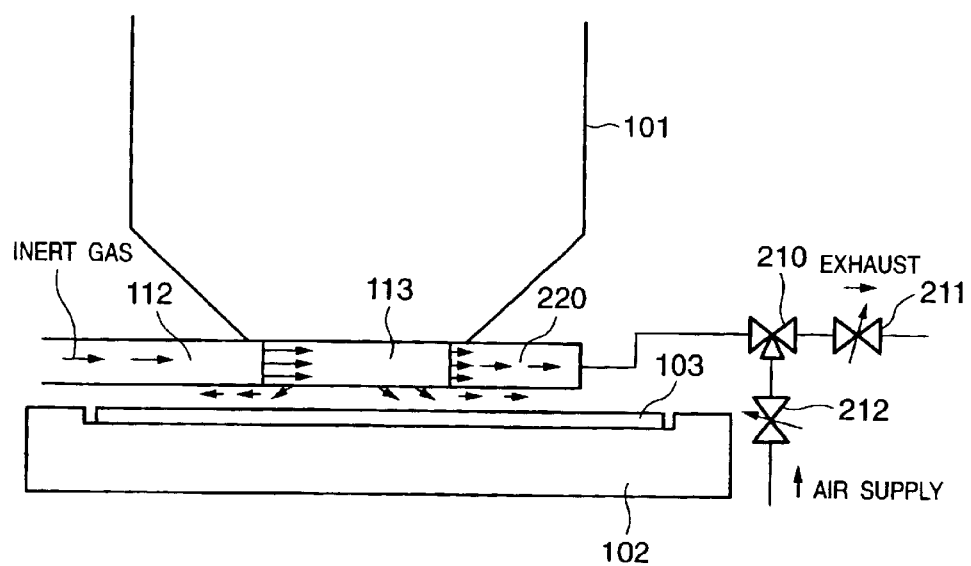
FIG. 11 is a view showing part of an exposure apparatus according to a modification of the fourth embodiment of the present invention.
Figure 12:
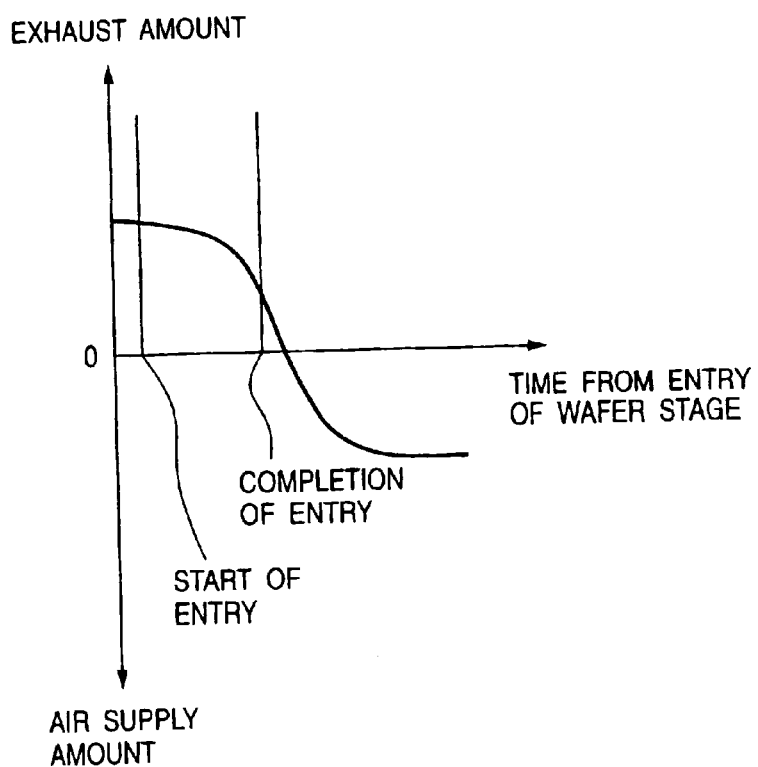
FIG. 12 is a graph showing control of supply/exhaust of inert gas in the modification shown in FIG. 11.

FIG. 11 is a schematic view showing the lower part of the projection optical system (lens barrel) of an exposure apparatus and the vicinity of a wafer according to a modification of the fourth embodiment of the present invention. FIG. 11 does not illustrate building components 131 to 134 in FIG. 1 for descriptive convenience. FIG. 12 is a graph showing supply/exhaust control of inert gas in this modification.

In this modification, the other end of a supply/exhaust portion 220, one end of which is connected to the optical path space 113, is connected via a valve 210 having a flow path switching function to a flow rate controller 211 for controlling an exhaust flow rate and a flow rate controller 212 for controlling a supply flow rate. The valve 210 can switch between a state in which the supply/exhaust portion 220 is connected to the exhaust-side flow rate controller 211 and a state in which the supply/exhaust portion 220 is connected to the supply-side flow rate controller 212. The valve 210 and the flow rate controllers 211 and 212 are controlled by an environment controller (corresponding to the environment controller 131 in FIG. 1).

In the modification, as shown in FIG. 12, the supply/exhaust portion 220 is used as an exhaust portion (exhaust port) when the wafer stage 102 enters the optical path space 113. Midway through exhaust operation, the exhaust amount is decreased by the flow rate controller 211. When the exhaust amount decreases to 0, the valve 210 is switched to gradually increase the supply amount by the flow rate controller 212. Then, the supply/exhaust portion 220 is used as an air supply portion (supply port). This control can shorten the time required to purge gas in the optical path space 113 with inert gas while reducing the influence of involving an ambient atmosphere by movement of the wafer stage 102 or the like.

Even if the flow velocity distribution of inert gas supplied from the inert gas supply portion 112 is uniform, the time required to purge gas in the optical path space 113 with inert gas can be shortened by the above-described control of the exhaust portion. Similar to the first embodiment, inert gas is preferably supplied at a higher speed at a portion closer to the final optical member of a projection optical system 101 and a portion closer to the center of exposure (optical axis). Instead of this, similar to the second embodiment, the flow velocity distribution of inert gas supplied from the inert gas supply portion 112 may be made uniform, and the flow velocity distribution of inert gas exhausted from the supply/exhaust portion 220 may be controlled. This control can further shorten the purge time.

When the fourth embodiment is applied to a scanning exposure apparatus, the supply and exhaust directions of inert gas by the air supply portion 112 and supply/exhaust portion 220 are made parallel to the scanning direction (moving direction) of the wafer stage 102. The concentration distribution of inert gas perpendicular to the scanning direction can be made uniform.

[Fifth Embodiment]

Figure 13:
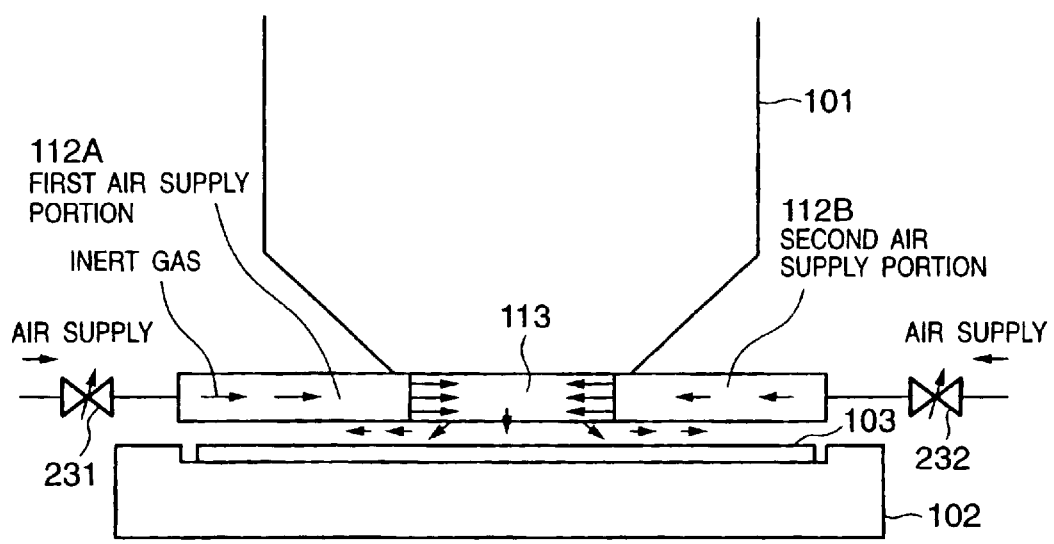
FIG. 13 is a view showing part of an exposure apparatus according to the fifth embodiment of the present invention.
Figure 14:
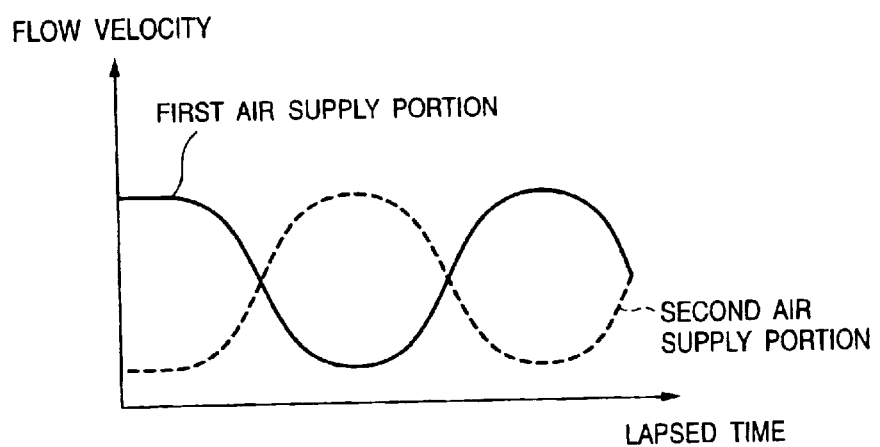
FIG. 14 is a graph showing control of the supply amount in the fifth embodiment of the present invention.

FIG. 13 is a schematic view showing the lower part of the projection optical system (lens barrel) of an exposure apparatus and the vicinity of a wafer according to the fifth embodiment of the present invention. FIG. 13 does not illustrate building components 131 to 134 in FIG. 1 for descriptive convenience. FIG. 14 is a graph showing control of the supply amount in the fifth embodiment.

This embodiment adopts two facing air supply portions 112A and 112B, and flow rate controllers 231 and 232 for them. The flow rate controllers 231 and 232 are controlled by an environment controller (corresponding to the environment controller 131 in FIG. 1).

As shown in FIG. 14, the fifth embodiment changes the flow rates (supply amounts) of inert gas from the air supply portions 112A and 112B while maintaining the sum of the flow rates (supply amounts) of inert gas from the air supply portions 112A and 112B. Under this control, the atmosphere in an optical path space 113 can be stirred while the pressure is kept almost constant (positive pressure) in the optical path space 113, thereby shortening the purge time.

In place of trigonometrically changing the flow rate, as shown in FIG. 14, the flow rate may be changed like pulses, linearly, or in accordance with another function. Also in this case, the sum of the flow rates of inert gas supplied from the two air supply portions is preferably kept almost constant. This control can also stir the atmosphere in an optical path space 113 while maintaining an almost constant pressure (positive pressure) in the optical path space 113, thus shortening the purge time.

Even if the supply amounts from the air supply portions are constant, they can be set different from each other. Then, a place where the flow velocity becomes low in the optical path space 113 shifts from the center. The purge time of the atmosphere in the optical path space with inert gas can be shortened.

In the fifth embodiment, the supply amounts of inert gas from the two air supply portions are changed by the flow rate adjustment valve. Alternatively, pipes extending from a single inert gas supply source may be changed to change the pressure loss between the pipes, and the supply amounts of inert gas supplied to the optical path space 113 via these pipes may be changed.

Even when the flow velocity distribution of inert gas supplied from the inert gas supply portion 112 is uniform, the time required to purge gas in the optical path space 113 with inert gas can be shortened by the above-described control of the supply portion. Similar to the first embodiment, inert gas is preferably supplied at a higher speed at a portion closer to the final optical member of a projection optical system 101 and a portion closer to the center of exposure (optical axis). Instead of this, similar to the second embodiment, the flow velocity distribution of inert gas supplied from the inert gas supply portion 112 may be made uniform, and the flow velocity distribution of inert gas exhausted from a supply/exhaust portion 220 may be controlled. This control can further shorten the purge time.

A plurality of supply portions may be so arranged as to surround the optical path space, and the flow rates of the supply portions may be set different from each other. Also in this case, the atmosphere in the optical path space can be stirred to shorten the purge time of inert gas.

Figure 15:
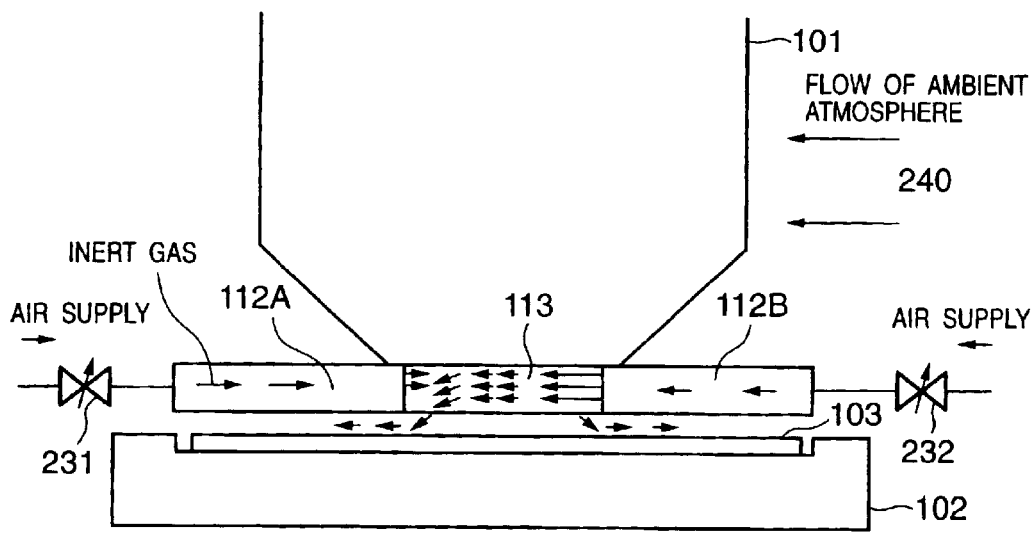
FIG. 15 is a view showing part of an exposure apparatus according to a modification of the fifth embodiment of the present invention.

FIG. 15 is a view showing a modification of the fifth embodiment. This modification increases the supply amount of inert gas from the air supply portion 112B on the upstream side of an ambient atmosphere flow 240 out of the two facing air supply portions 112A and 112B. To the contrary, inert gas is supplied to only the upper part of the optical path space 113 from the downstream-side air supply portion 112A. By setting or controlling different supply amounts from the respective air supply portions and different flow velocity distributions of supplied inert gas, the purge time can be shortened at a portion where the purge time is generally long, such as the upper part of the optical path space 113 and the downstream side of the ambient atmosphere flow.

This modification increases the supply amount of inert gas flowing in the same direction as the flow of the ambient atmosphere. Alternatively, the supply amount of inert gas supplied from one air supply portion may be set larger than that of inert gas supplied from the other air supply portion regardless of the flow of the ambient atmosphere. As a result, the purge time becomes shorter in comparison with a case in which inert gas is supplied from the two air supply portions with the same supply amount.

[Sixth Embodiment]

Figure 16:
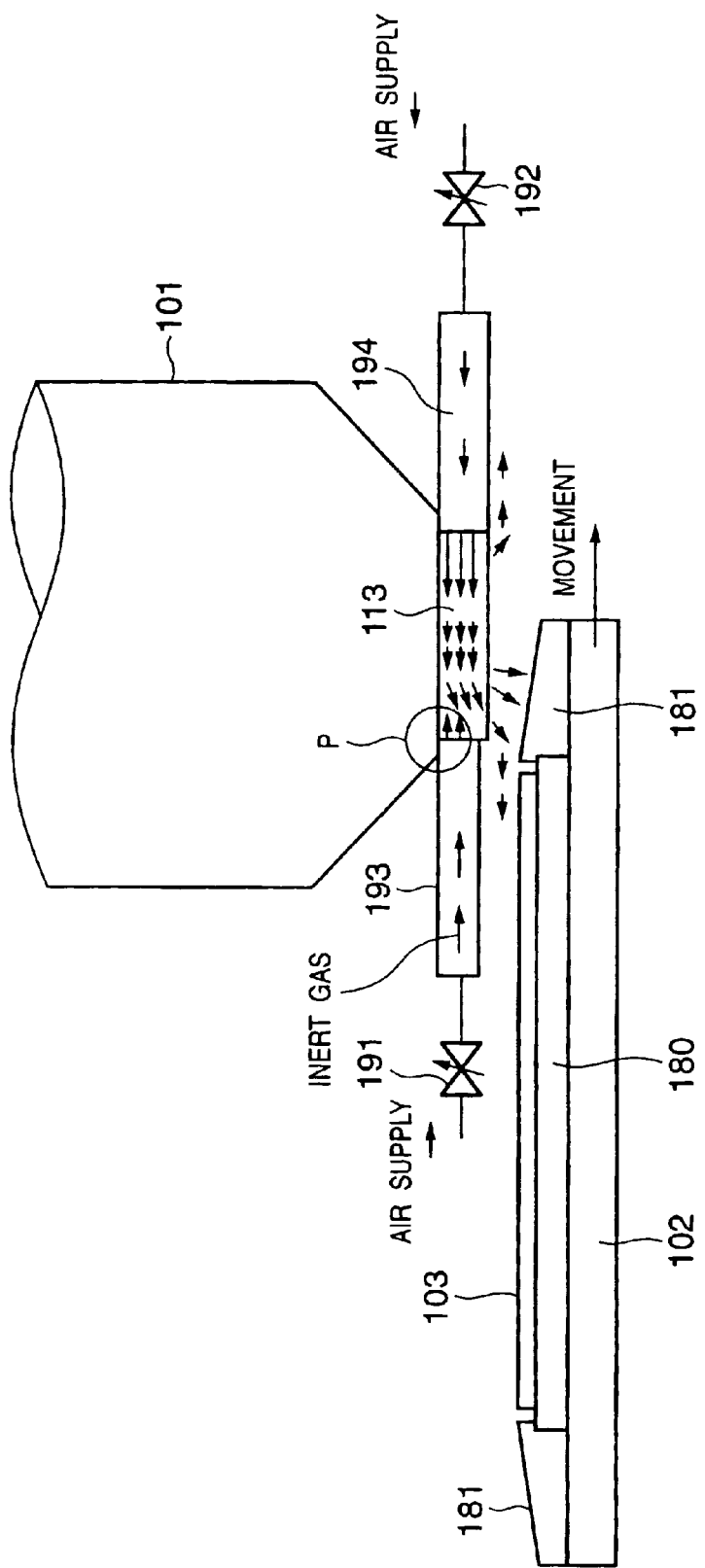
FIG. 16 is a view showing part of an exposure apparatus according to the sixth embodiment of the present invention.

FIG. 16 is a schematic view showing part of an exposure apparatus according to the sixth embodiment of the present invention. The sixth embodiment achieves a shorter purge time by adding the following two arrangements to the first to fifth embodiments.

First, a level adjustment plate 181 with a slope enough to smooth a change in level between a wafer 103 and a surrounding portion is arranged around a wafer 103 on a wafer stage 102. The level adjustment plate 181 suppresses an abrupt change in aperture ratio below an optical path space 113 when the wafer 103 enters the optical path space 113. Thus, the level adjustment plate 181 increases the exhaust efficiency of the optical path space 113.

Second, air supply portions 193 and 194 for supplying inert gas from an air supply path to the optical path space 113 are so arranged as to face each other. Of four sides which surround the optical path space 113, three sides have the same height, and the height from the remaining side to the wafer 103 is designed larger. In this embodiment, the height to the wafer 103 from the air supply portion 193 on the downstream side of the flow of an ambient atmosphere is designed larger than the remaining three sides. This increases the exhaust efficiency of the optical path space 113 on the downstream side of the ambient atmosphere where exhaust is hardly influenced by the flow of the ambient atmosphere.

All or part of the two arrangements can be added to the first to fifth embodiments to further increase the exhaust efficiency of the optical path space 113 and further shorten the purge time.

At a portion P in FIG. 16, the gas flow velocity tends to decrease when inert gas is supplied from only one direction, as described above. To process a wafer which produces a contaminant, the contaminant readily stays at the portion P. This embodiment can, however, remove such a contaminant. That is, the height to the wafer 103 from the air supply portion 193 positioned on the downstream side of the flow of an ambient atmosphere around the optical path space 113 is designed larger than the heights of the remaining three sides, thus increasing the flow velocity at the portion P.

[Seventh Embodiment]

Figure 17:
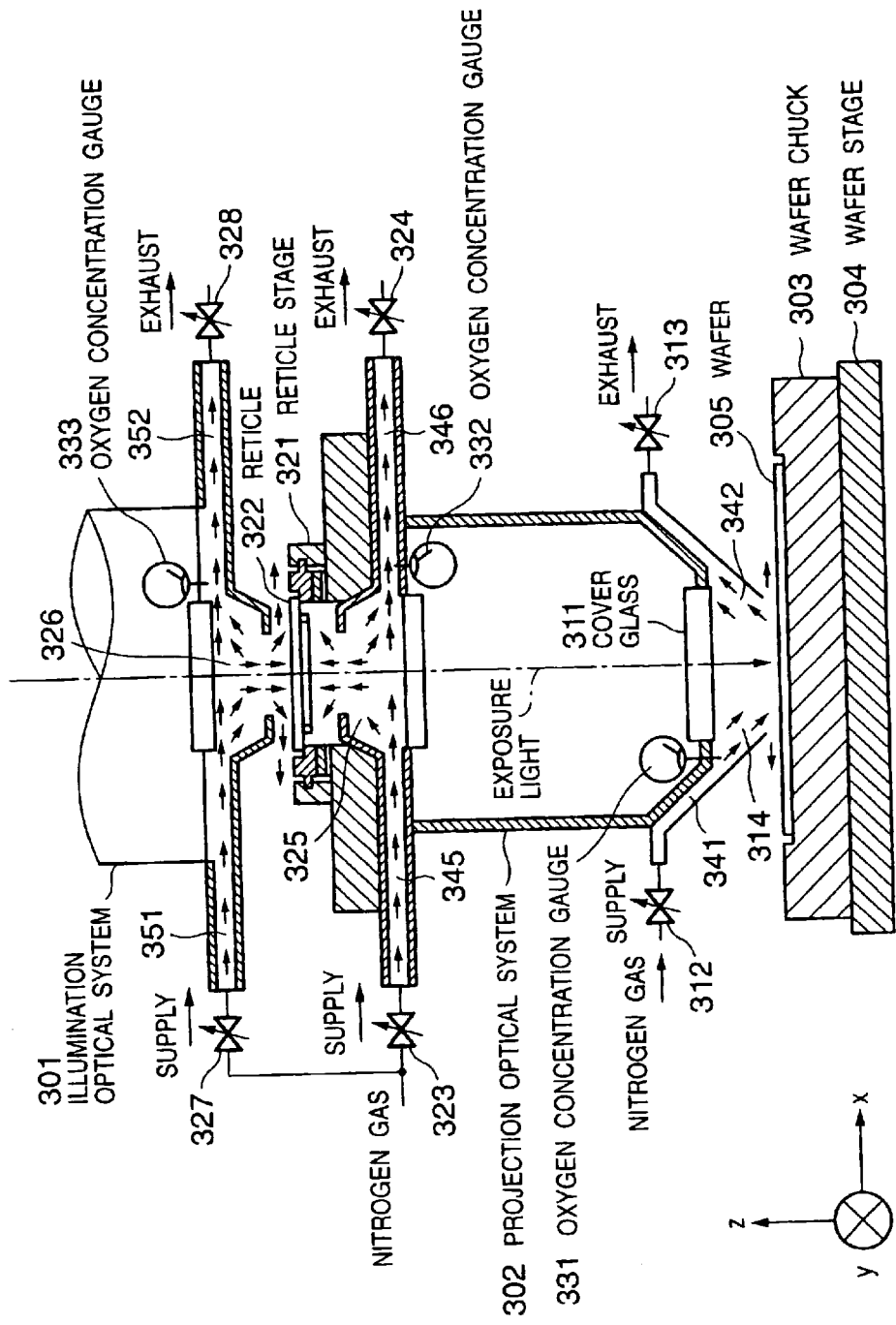
FIG. 17 is a sectional view showing part of an exposure apparatus according to the seventh embodiment of the present invention.

The inventions applied between the projection optical system and the wafer stage in the first to sixth embodiments can also be applied between the illumination optical system and the reticle stage and between the reticle stage and the projection optical system. FIG. 17 is a sectional view showing an exposure apparatus in which the present invention is applied between the projection optical system and the wafer stage, between the illumination optical system and the reticle stage, and between the reticle stage and the projection optical system.

In the exposure apparatus shown in FIG. 17, a first air supply portion 341 which supplies inert gas to a first optical path space 314, a first flow rate controller 312 which controls the supply amount of inert gas, a first exhaust portion 342 which exhausts inert gas and the like from the first optical path space 314, and a first flow rate controller 313 which controls the exhaust amount of inert gas and the like are arranged for the first optical path space 314 defined by a final optical member (cover glass) 311 of a projection optical system 302 and a wafer chuck 303 (wafer 305). This arrangement purges gas in the first optical path space 314 with inert gas while spatially or temporally changing the flow velocity distribution of gas flowing through the first optical path space 314.

A second air supply portion 351 which supplies inert gas to a second optical path 326, a second flow rate controller 327 which controls the supply amount of inert gas, a second exhaust portion 352 which exhausts inert gas and the like from the second optical path space 326, and a third flow rate controller 328 which controls the exhaust amount of inert gas and the like are arranged for the second optical path space 326 defined by an illumination optical system 301 for illuminating a reticle (mask) 322 and a reticle stage (reticle 322) 321. This arrangement purges gas in the second optical path space 326 with inert gas while spatially or temporally changing the flow velocity distribution of gas flowing through the second optical path space 326.

A third air supply portion 345 which supplies inert gas to a third optical path space 325, a third flow rate controller 323 which controls the supply amount of inert gas, a third exhaust portion 346 which exhausts inert gas and the like from the third optical path space 325, and a third flow rate controller 324 which controls the exhaust amount of inert gas and the like are arranged for the third optical path space 325 defined by the reticle stage 321 and the projection optical system 302. This arrangement purges gas in the third optical path space 325 with inert gas while spatially or temporally changing the flow velocity distribution of gas flowing through the third optical path space 325.

Inert gas (e.g., nitrogen gas or helium gas) is supplied to the first to third optical path spaces.

In FIG. 17, the reticle stage is controlled by a stage controller in synchronism with the wafer stage, and each valve is controlled by an environment controller. Each controller is comprehensively controlled by a main controller.

[Eighth Embodiment]

Figure 18:
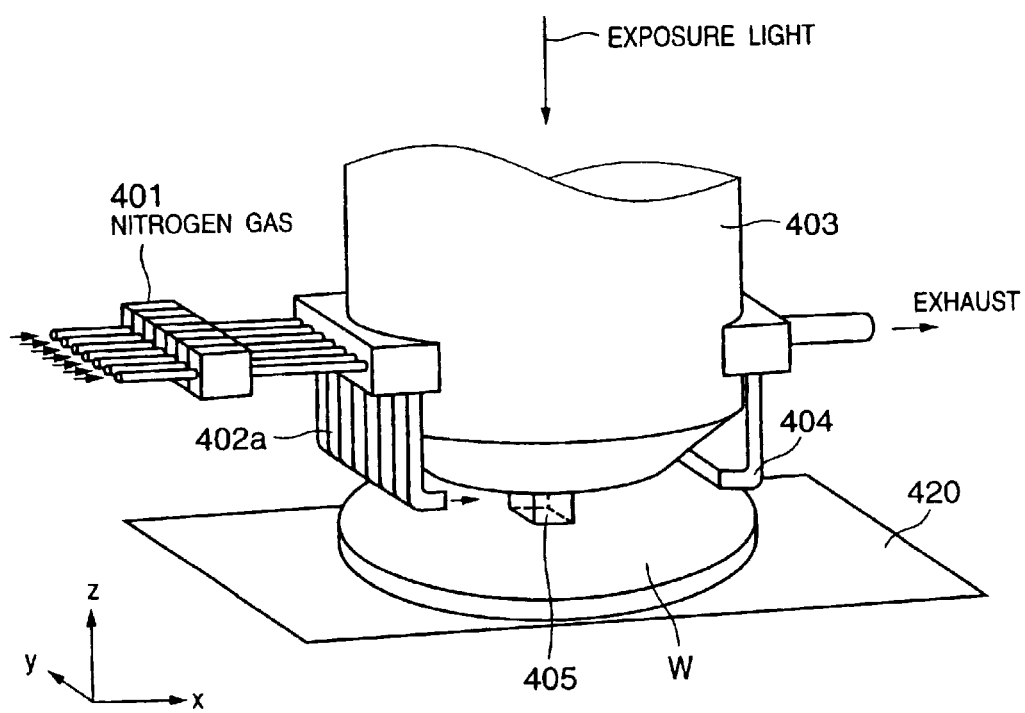
FIG. 18 is a perspective view showing part of an exposure apparatus according to the eighth embodiment of the present invention.

FIG. 18 is a perspective view showing the lower part of the projection optical system (lens barrel) of an exposure apparatus and the vicinity of a wafer according to the eighth embodiment of the present invention.

This exposure apparatus comprises a light source (not shown) such as an $F_2$ excimer laser which generates a short-wavelength laser beam as illumination light. Illumination light (exposure light) generated by the light source uniformly illuminates a reticle (mask) via a proper illumination optical member. Light (exposure light) having passed through the reticle reaches the surface of a wafer W set on a wafer stage 402 via various optical members which constitute a projection optical system 403. The light forms the reticle pattern on the surface of the wafer W.

The wafer stage 402 which supports the wafer W is movable three-dimensionally (X, Y, and Z directions). The reticle pattern is sequentially projected and transferred onto the wafer W by a so-called step & repeat method of repeating stepping movement and exposure. This arrangement is almost the same when the present invention is applied to a scanning exposure apparatus.

In exposure, temperature-controlled inert gas (e.g., nitrogen gas or helium gas) is supplied via a flow velocity controller group 401 and air supply port group (air supply portions) 402a to a space (to be referred to as an optical path space hereinafter) 430 including a space and its vicinity through which exposure light passes between the final optical member of the projection optical system 403 and the wafer W (see FIG. 19). Part of inert gas supplied to the optical path space 430 is recovered at an exhaust portion 404 and exhausted via an exhaust valve (not shown).

Figure 19:
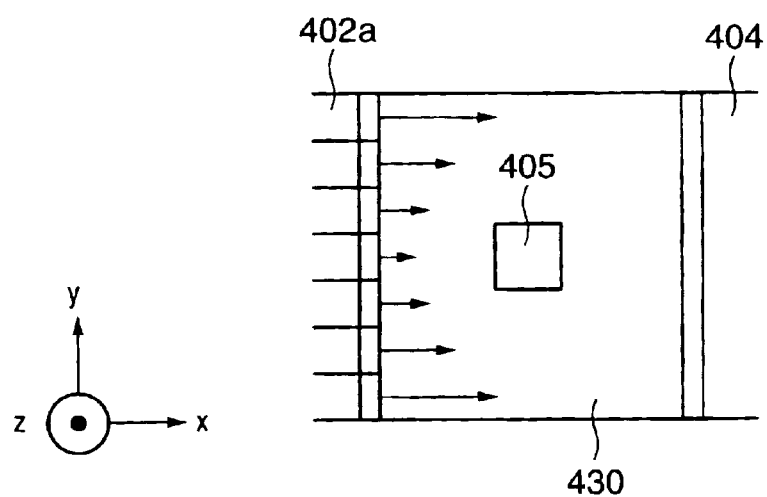
FIG. 19 is a plan view showing an example of the flow velocity distribution of inert gas in an optical path space according to the eighth embodiment of the present invention.

FIG. 19 is a plan view showing an example of the flow velocity distribution of inert gas in the optical path space 430. In the eighth embodiment, inert gas is supplied at a lower flow velocity at a portion closer to the center of exposure (exposure region) and a higher flow velocity at a portion closer to the periphery. This flow velocity distribution can be obtained by individually controlling the respective flow rate velocity controllers of the flow velocity controller group 401. Forming such a flow velocity distribution can effectively prevent entrance of an ambient atmosphere into the optical path region 430, i.e., a decrease in the concentration or purity of inert gas in the optical path space 430 (particularly an exposure region 405). This flow velocity distribution is suitable for maintaining inert gas in the optical path space 430 after purge is completed.

[Ninth Embodiment]

Figure 20:
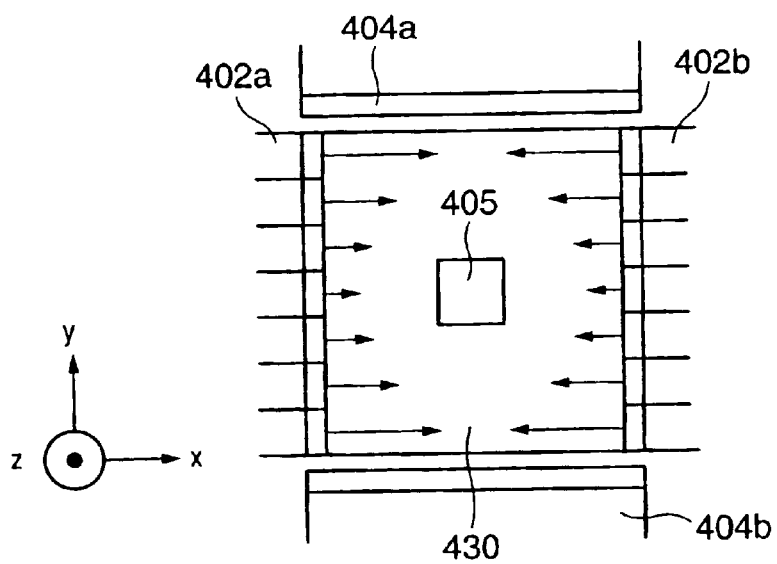
FIG. 20 is a plan view showing an air supply port group and exhaust portion according to the ninth embodiment of the present invention.

The ninth embodiment relates to a modification of the air supply port group and exhaust portion in the eighth embodiment. FIG. 20 is a plan view showing an air supply port group and exhaust portion according to the ninth embodiment of the present invention. In the ninth embodiment, a second air supply port group (second air supply portion) 402b is arranged at the position of the exhaust port group (exhaust portion) 404 described above so as to face an air supply port group 402a. Inert gas is also supplied from the second air supply port group 402b to an optical path space 430 at a lower flow velocity at a portion closer to the center of exposure (exposure region) and a higher flow rate velocity at a portion closer to the periphery. In this case, as shown in FIG. 20, first and second exhaust portions 404a and 404b are preferably so arranged as to face each other on two sides except two sides occupied by the first and second air supply port groups 402a and 402b.

[10th Embodiment]

Figure 21:
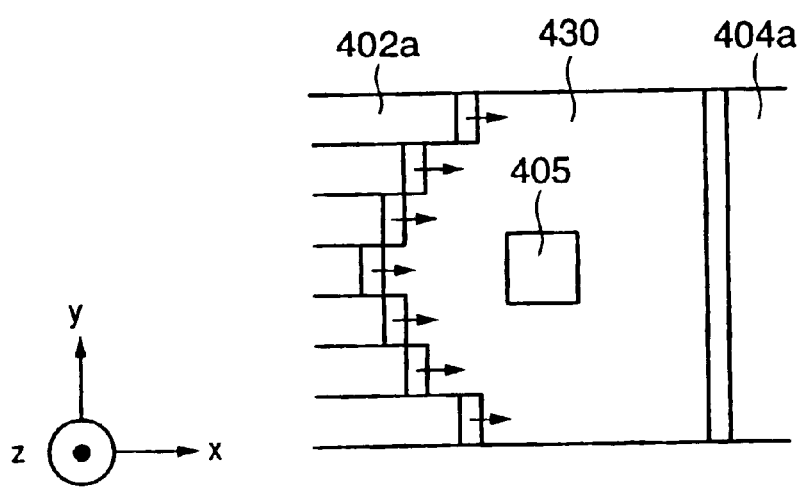
FIG. 21 is a plan view showing an air supply port group and exhaust portion according to the 10th embodiment of the present invention.

The 10th embodiment concerns a modification of the arrangement of the air supply port group in the seventh embodiment. FIG. 21 is a plan view showing an air supply port group and exhaust portion according to the 10th embodiment of the present invention.

The 10th embodiment attains the same effects as those of the seventh embodiment by shifting the distal end positions of a plurality of air supply ports which constitute an air supply port group 402a. More specifically, in the 10th embodiment, a plurality of air supply ports which constitute the air supply port group 402a are arranged such that a supply port (outer supply port) which supplies inert gas to a region apart from the center of exposure (exposure region) projects in the supply direction (X direction). A plurality of air supply ports supply inert gas in the same direction. Inert gas supplied from the air supply port group 402a is recovered and exhausted by an exhaust portion 404a.

[11th Embodiment]

Figure 22:
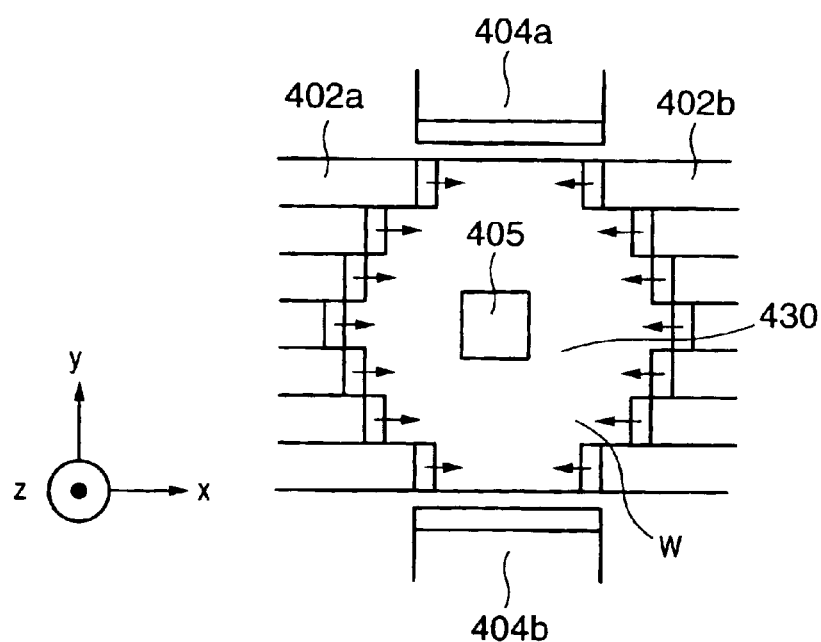
FIG. 22 is a plan view showing an air supply port group and exhaust portion according to the 11th embodiment of the present invention.

The 11th embodiment concerns a modification of the arrangements of the air supply port groups in the ninth and 10th embodiments. FIG. 22 is a plan view showing an air supply port group and exhaust portion according to the 11th embodiment of the present invention.

In the 11th embodiment, a plurality of air supply ports which constitute the first and second air supply port groups 402a and 402b in the ninth embodiment are arranged by applying the 10th embodiment. This layout provides the same effects as those of the ninth embodiment.

More specifically, as shown in FIG. 22 in the 11th embodiment, a plurality of air supply ports which constitute an air supply port group 402a are arranged such that a supply port (outer supply port) which supplies inert gas to a region apart from the center of exposure (exposure region) projects in the supply direction (X direction). A plurality of air supply ports supply inert gas in the same direction. Similarly, a plurality of air supply ports which constitute an air supply port group 402b are arranged such that a supply port (outer supply port) which supplies inert gas to a region apart from the center of exposure (exposure region) projects in the supply direction (negative direction along the X-axis). A plurality of air supply ports supply inert gas in the same direction. First and second exhaust portions 404a and 404b are preferably so arranged as to face each other on two sides except two sides occupied by the first and second air supply port groups 402a and 402b.

[12th Embodiment]

Figure 23:
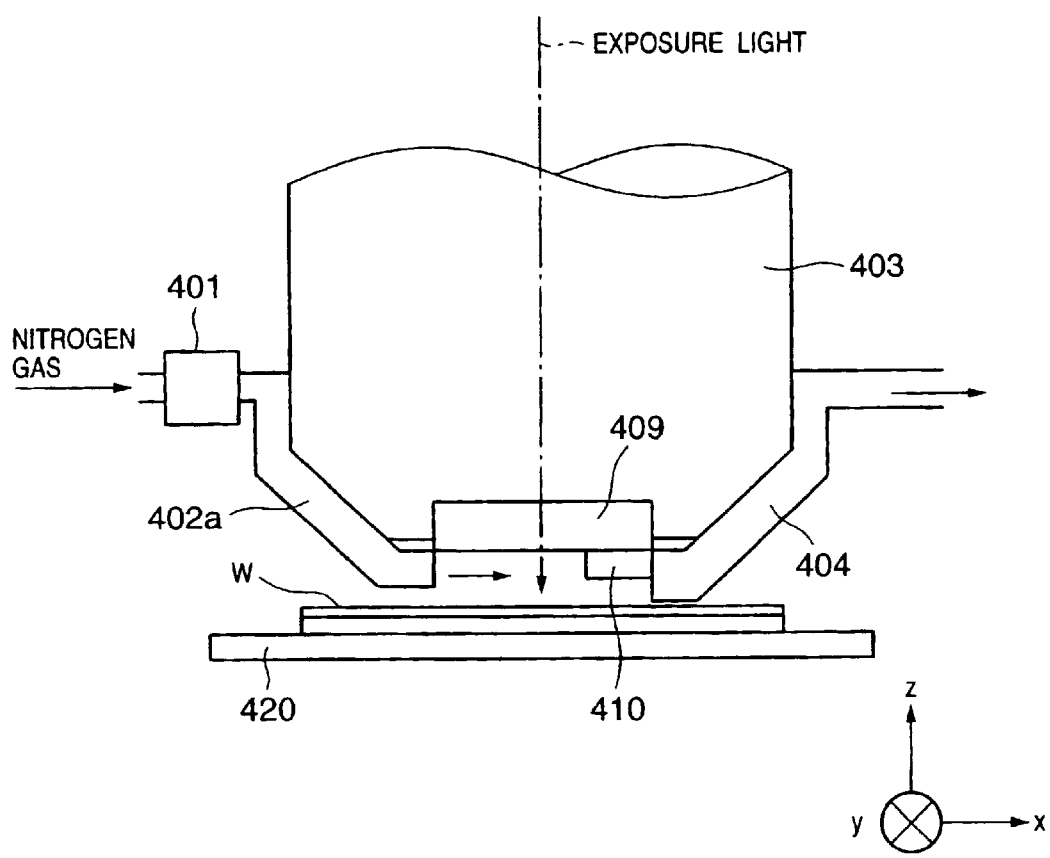
FIG. 23 is a view showing part of an exposure apparatus according to the 12th embodiment of the present invention.
Figure 24:
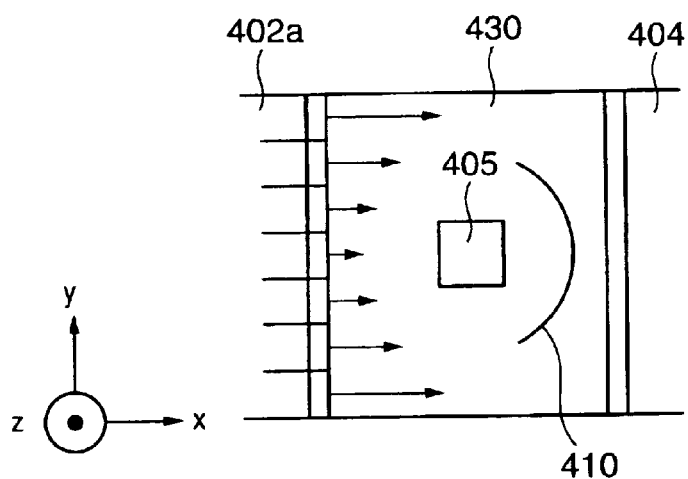
FIG. 24 is a plan view showing the vicinity of a wafer when viewed from above the exposure apparatus shown in FIG. 23.

FIG. 23 is a view showing the lower part of the projection optical system (lens barrel) of an exposure apparatus and the vicinity of a wafer according to the 12th embodiment of the present invention. FIG. 24 is a plan view showing the vicinity of the wafer when viewed from above the exposure apparatus shown in FIG. 23.

The arrangement of an air supply port group 402a complies with, e.g., the seventh embodiment. In the exposure apparatus of the 12th embodiment, a control wall 410 which controls the flow of inert gas is arranged on the downstream side of the flow of inert gas when viewed from an exposure region 405. The control wall 410 is attached to the lower portion of a projection optical system 403, and an appropriate interval is set between the lower end of the control wall 410 and a wafer W.

In this embodiment, the air supply port group 402a supplies inert gas to an optical path space 430 at a lower flow velocity at a portion closer to the center of exposure (exposure region) and a higher flow velocity at a portion closer to the periphery. The control wall 410 keeps high-purity inert gas on the upstream side, i.e., in the exposure region 405 and its surrounding region. By adopting the control wall 410, the 12th embodiment can maintain high purity of inert gas in the exposure region 405 and its surrounding region.

The 12th embodiment can be effectively combined with, e.g., the 10th embodiment.

[13th Embodiment]

Figure 25:
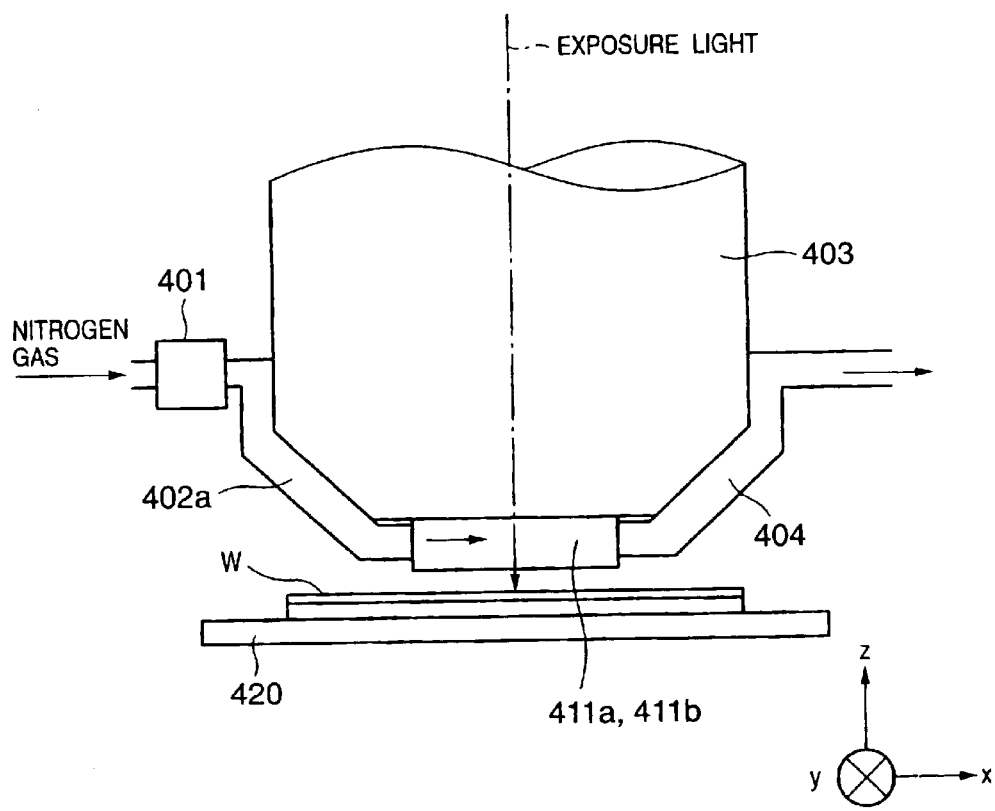
FIG. 25 is a view showing part of an exposure apparatus according to the 13th embodiment of the present invention.
Figure 26:
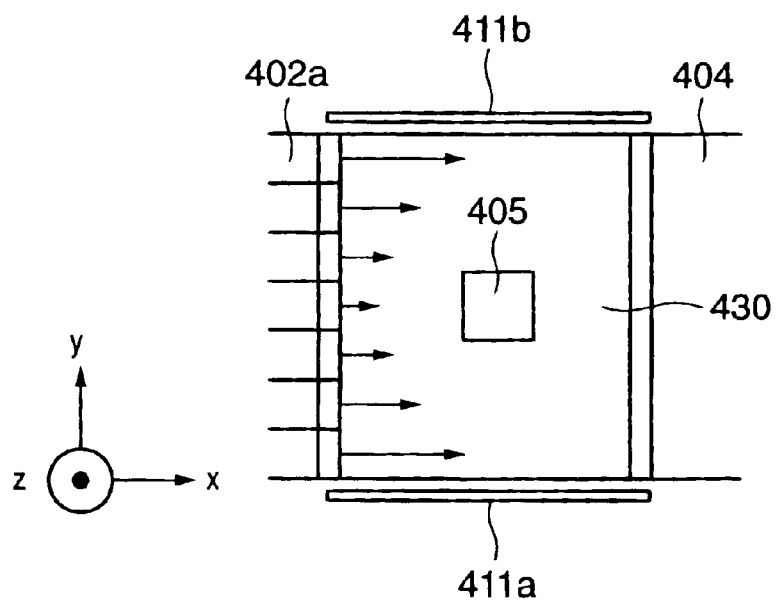
FIG. 26 is a plan view showing the vicinity of a wafer when viewed from above the exposure apparatus shown in FIG. 25.

FIG. 25 is a view showing the lower part of the projection optical system (lens barrel) of an exposure apparatus and the vicinity of a wafer according to the 13th embodiment of the present invention. FIG. 26 is a plan view showing the vicinity of the wafer when viewed from above the exposure apparatus shown in FIG. 25.

In the 13th embodiment, a shielding member which separates the optical path space and ambient space from each other is added to the exposure apparatus of the eighth embodiment. More specifically, two facing shielding members 411a and 411b are arranged on two sides other than two sides occupied by a supply port group 402a and exhaust portion 404 out of the four sides of the side planes of an optical path space 430 between a projection optical system 403 and a wafer W (wafer stage 420). The shielding members 411a and 411b are attached to the lower end of the projection optical system 403. In the 13th embodiment, the side planes of the optical path space 430 are surrounded by the supply port group 402a, the exhaust portion 404, and the shielding members 411a and 411b.

In the 13th embodiment, inert gas is supplied at a lower flow velocity at a portion closer to the center of exposure (exposure region) and a higher flow velocity at a portion closer to the periphery. The 13th embodiment suppresses entrance of an ambient atmosphere into the optical path space 430 by the flow velocity distribution of inert gas and also by the shielding members 411*a* and 411*b*.

Shielding members can also be arranged on another side in addition to the two sides. For example, shielding members may be so arranged as to completely surround the side planes of the optical path space.

The 13th embodiment can be effectively combined with, e.g., the ninth to 12th embodiments.

Figure 27:
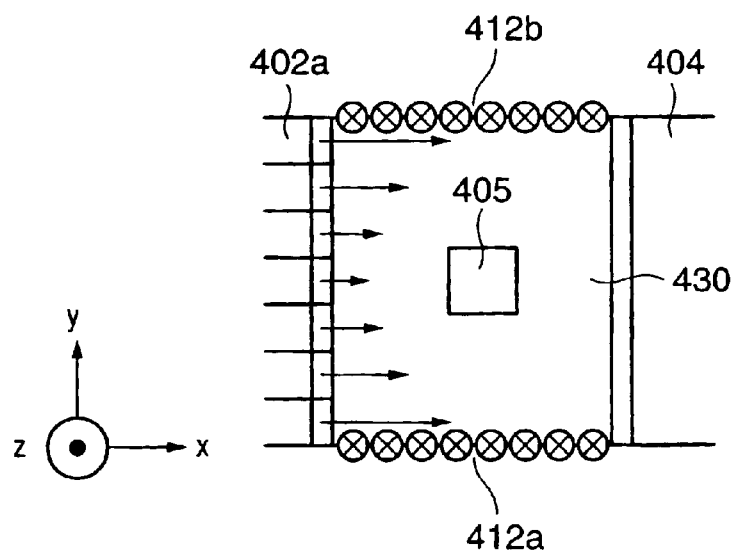
FIG. 27 is a plan view showing a modification of the 13th embodiment of the present invention.

FIG. 27 is a plan view showing a modification of the 13th embodiment. This modification suppresses entrance of an ambient atmosphere into the optical path space 430 by forming flows 412*a* and 412*b* of inert gas along the optical axis (Z-axis), instead of the shielding members 411*a* and 411*b* of FIG. 26.

[14th Embodiment]

Figure 28:
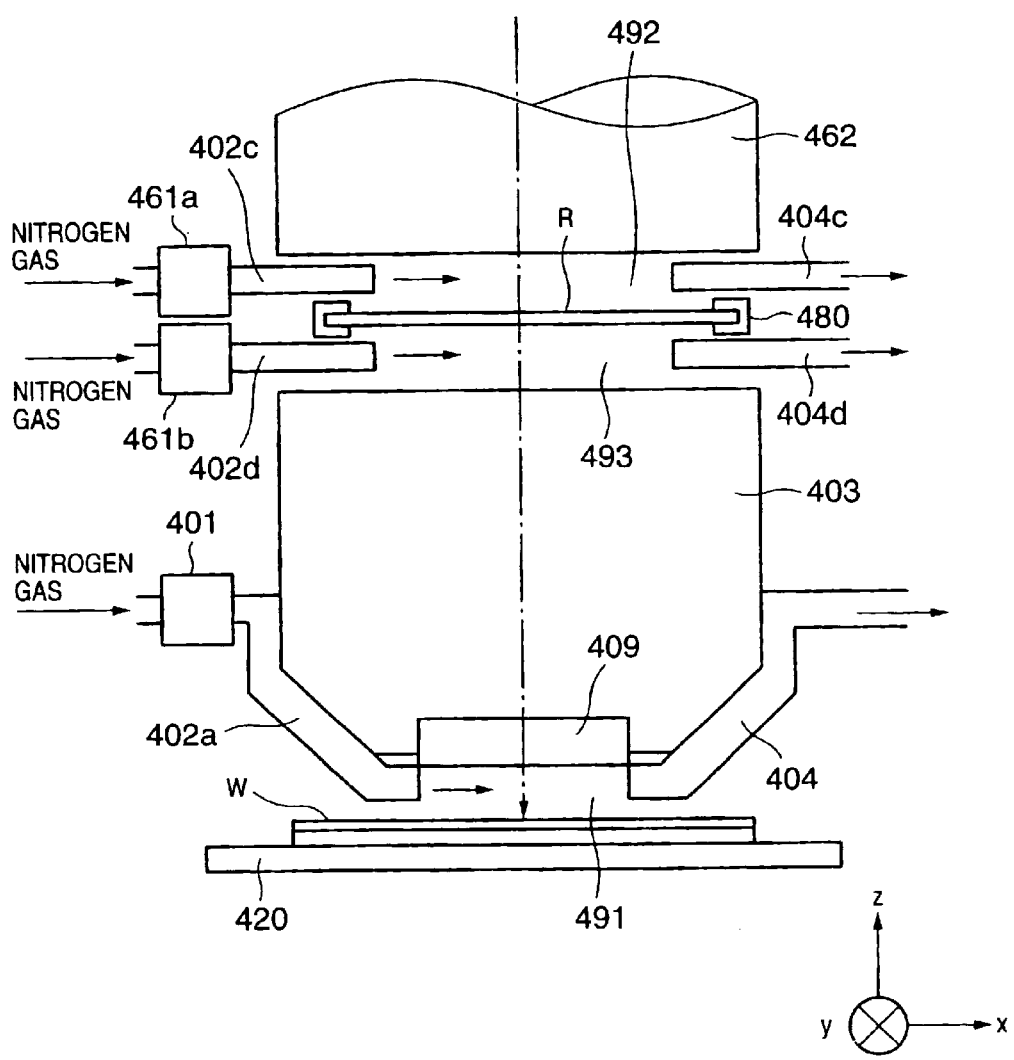
FIG. 28 is a view showing an exposure apparatus in which the present invention is applied between a projection optical system and a wafer stage, between an illumination optical system and a reticle stage, and between the reticle stage and the projection optical system.
Figure 29:
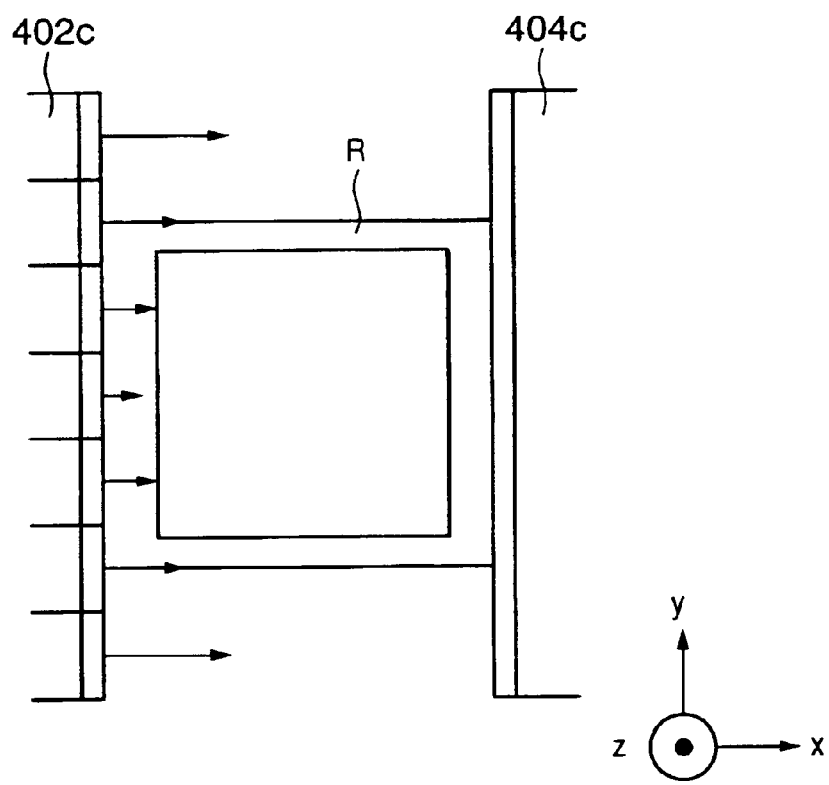
FIG. 29 is a plan view showing the flow velocity distribution of inert gas on a reticle surface when a reticle is viewed from the illumination optical system in FIG. 28.

The inventions applied between the projection optical system and the wafer stage in the eighth to 13th embodiments can also be applied between the illumination optical system and the reticle stage and between the reticle stage and the projection optical system. FIG. 28 is a view showing an exposure apparatus in which the present invention is applied between the projection optical system and the wafer stage, between the illumination optical system and the reticle stage, and between the reticle stage and the projection optical system. FIG. 29 is a plan view showing the flow velocity distribution of inert gas on the reticle surface when the reticle is viewed from the illumination optical system.

In the exposure apparatus shown in FIG. 28, a first air supply port group 402*a* which supplies inert gas to a first optical path space 491, a first flow rate controller group 401 which controls the supply amount of inert gas, and a first exhaust portion 404 which exhausts inert gas and the like from the first optical path space 491 are arranged for the first optical path space 491 defined by a final optical member (cover glass) 409 of a projection optical system 402 and a wafer stage 420 (wafer W). The first flow rate controller group 401 controls the flow velocity distribution of inert gas in a first optical path region 491 so as to decrease the flow velocity at a portion closer to the center of exposure (exposure region) and increase the flow velocity at a portion closer to the periphery.

A second air supply port group 402*c* which supplies inert gas to a second optical path space 492, a second flow rate controller group 461*a* which controls the supply amount of inert gas, and a second exhaust portion 404*c* which exhausts inert gas and the like from the second optical path space 492 are arranged for the second optical path space 492 defined by an illumination optical system 462 which illuminates a reticle (mask) R and a reticle stage 480 (reticle R). The second flow rate controller group 461*a* controls the flow velocity distribution of inert gas in a second optical path region 492 so as to decrease the flow velocity at a portion closer to the center of exposure (exposure region) and increase the flow velocity at a portion closer to the periphery.

A third air supply port group 402*d* which supplies inert gas to a third optical path space 493, a third flow rate controller group 461*b* which controls the supply amount of inert gas, and a third exhaust portion 404*d* which exhausts inert gas and the like from the third optical path space 493 are arranged for the third optical path space 493 defined by the reticle stage 480 and a projection optical system 403. The third flow rate controller group 461*b* controls the flow velocity distribution of inert gas in a third optical path region 493 so as to decrease the flow velocity at a portion closer to the center of exposure (exposure region) and increase the flow velocity at a portion closer to the periphery.

Inert gas (e.g., nitrogen gas or helium gas) is supplied to the first to third optical path spaces.

In FIG. 28, the reticle stage is controlled by a stage controller in synchronism with the wafer stage, and each valve is controlled by an environment controller. Each controller is comprehensively controlled by a main controller.

[Application of Exposure Apparatus]

Figure 30:
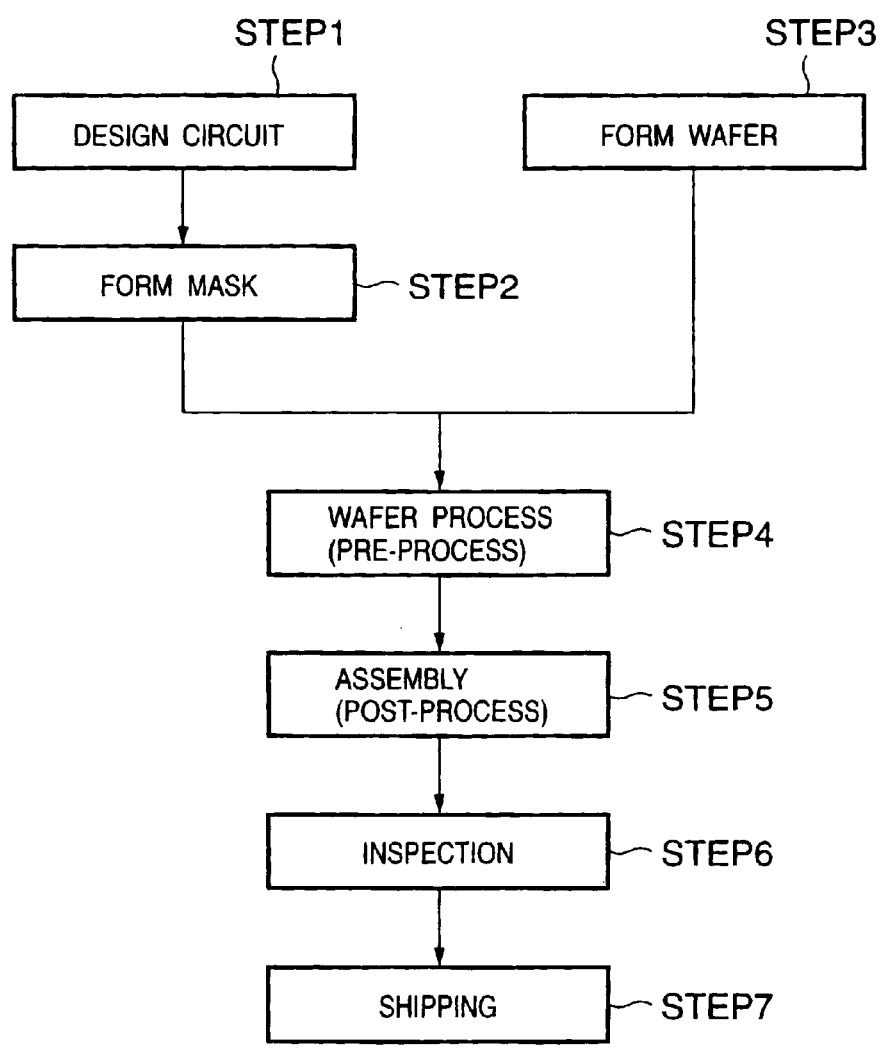
FIG. 30 is a flow chart showing the flow of the whole manufacturing process of a semiconductor device.

A semiconductor device manufacturing process using the above-described exposure apparatus will be explained. FIG. 30 shows the flow of the whole manufacturing process of the semiconductor device. In step 1 (circuit design), a semiconductor device circuit is designed. In step 2 (mask formation), a mask is formed based on the designed circuit pattern. In step 3 (wafer formation), a wafer is formed by using a material such as silicon. In step 4 (wafer process) called a pre-process, an actual circuit is formed on the wafer by lithography using the mask and wafer. Step 5 (assembly) called a post-process is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and durability test. After these steps, the semiconductor device is completed and shipped (step 7).

Figure 31:
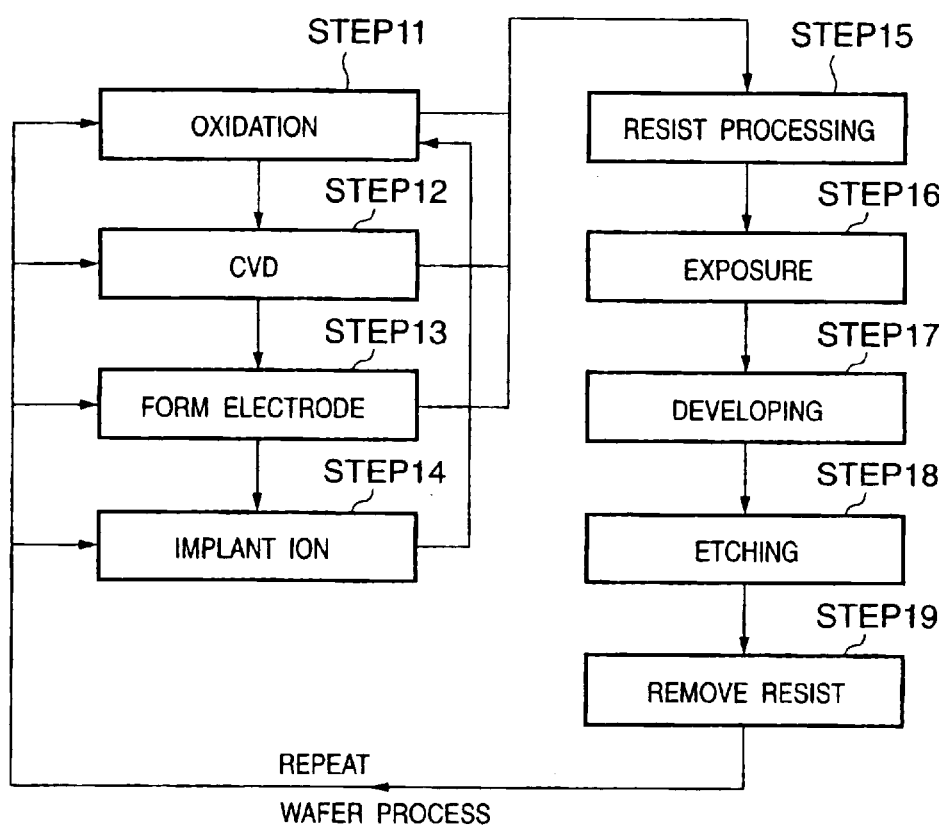
FIG. 31 is a flow chart showing the flow of the whole manufacturing process of the semiconductor device.
Figure 32:
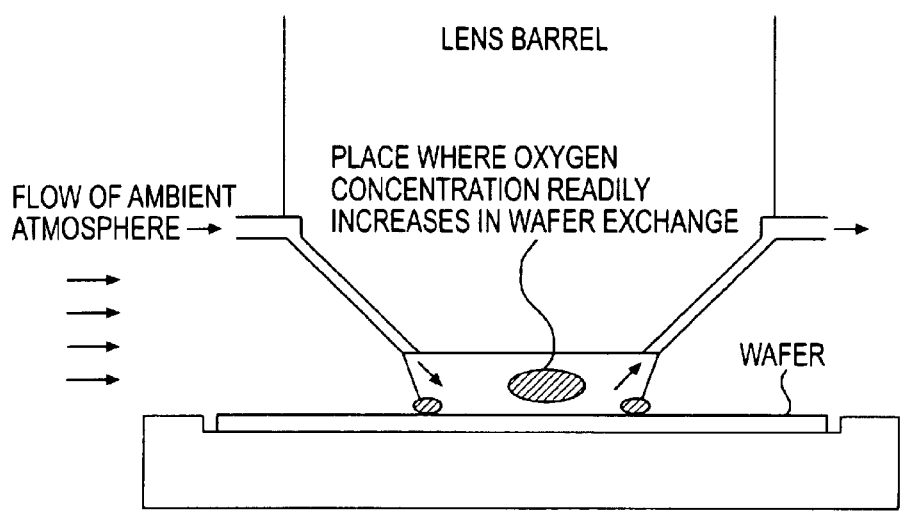
FIG. 32 is a view for explaining the problem of a conventional exposure apparatus.

FIG. 31 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus transfers the circuit pattern onto the wafer. In step 17 (developing), the exposed wafer is developed. In step 18 (etching), the resist is etched except for the developed resist image. In step 19 (resist removal), any unnecessary resist after etching is removed. These steps are repeated to form multiple circuit patterns on the wafer.

The present invention can shorten a time required to purge gas in an optical path space with inert gas, and/or to maintain the purity or concentration of inert gas in the optical path space at a proper level.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus which projects and transfers a pattern formed on a mask to a substrate by using exposure light, comprising:

a stage;

an optical system; and a gas flow formation mechanism which forms a flow of inert gas in an optical path space including a space through which light passes between said stage and said optical system, wherein said gas flow formation mechanism is arranged to form a flow of inert gas having a spatially or temporally nonuniform distribution in the optical path space.

2. The apparatus according to claim 1, wherein said gas flow formation mechanism is arranged to form a flow of inert gas having a nonuniform flow velocity distribution in the optical path space.

3. The apparatus according to claim 2, wherein said gas flow formation mechanism comprises a supply mechanism which supplies inert gas to the optical path space, and said supply mechanism is arranged to supply inert gas having a nonuniform flow velocity distribution to the optical path space.

4. The apparatus according to claim 2, wherein said gas flow formation mechanism comprises
a supply mechanism which supplies inert gas to the optical path space, and
an exhaust mechanism which exhausts gas containing inert gas from the optical path space, and
said exhaust mechanism is arranged to exhaust the gas containing the inert gas from the optical path space so as to form a nonuniform flow velocity distribution in the optical path space.

5. The apparatus according to claim 2, wherein the nonuniform flow velocity distribution includes a distribution in which a flow velocity is higher at a portion closer to said optical system.

6. The apparatus according to claim 2, wherein the nonuniform flow velocity distribution includes a distribution in which a flow velocity is higher at a portion closer to an optical axis of said optical system.

7. The apparatus according to claim 2, wherein said supply mechanism comprises two gas supply portions arranged at positions opposite to each other via the optical path space.

8. The apparatus according to claim 1, wherein said gas flow formation mechanism comprises a supply mechanism which supplies inert gas to the optical path space, and said supply mechanism changes a flow rate of inert gas supplied to the optical path space along with a lapse of time.

9. The apparatus according to claim 1, wherein said gas flow formation mechanism comprises two gas supply portions arranged at positions opposite to each other via the optical path space.

10. The apparatus according to claim 1, wherein said gas flow formation mechanism comprises at least two gas supply portions arranged at positions around the optical path space.

11. The apparatus according to claim 1, wherein said gas flow formation mechanism comprises at least two supply mechanisms which supply inert gas to the optical path space, and said at least two supply mechanisms are arranged to supply different supply amounts of inert gas from said respective supply mechanisms or to change flow rates of inert gas supplied from said respective supply mechanisms along with a lapse of time.

12. The apparatus according to claim 11, wherein said gas flow formation mechanism comprises at least two supply mechanisms which supply inert gas to the optical path space, and said at least two supply mechanisms are arranged to change flow rates of inert gas supplied from said at least two supply mechanisms to the optical path space along with a lapse of time while a sum of the flow rates of inert gas supplied from said at least two supply mechanisms to the optical path space is kept substantially constant.

13. The apparatus according to claim 1, wherein said gas flow formation mechanism is arranged to change a flow of inert gas formed in the optical path space in accordance with a change in positional relationship between said stage and the optical path space.

14. The apparatus according to claim 1, wherein said gas flow formation mechanism comprises
a supply mechanism which supplies inert gas to the optical path space, and
an exhaust mechanism which exhausts gas containing inert gas from the optical path space, and
said supply mechanism and said exhaust mechanism are arranged to change a supply amount and an exhaust amount in accordance with a change in positional relationship between said stage and the optical path space.

15. The apparatus according to claim 1, wherein said gas flow formation mechanism evacuates the optical path space by a predetermined exhaust amount when a predetermined region of said stage starts to enter the optical path space, and decreases the exhaust amount after the predetermined region of said stage completely enters the optical path space.

16. The apparatus according to claim 1, wherein said gas flow formation mechanism evacuates the optical path space by a predetermined exhaust amount when a predetermined region of said stage starts to enter the optical path space, and stops exhaust after the predetermined region of said stage completely enters the optical path space.

17. The apparatus according to claim 1, wherein said gas flow formation mechanism comprises
a supply mechanism which supplies inert gas to the optical path space, and
a supply/exhaust mechanism which supplies inert gas to the optical path space or exhausts gas containing inert gas from the optical path space, and
said gas flow formation mechanism causes said supply mechanism to supply inert gas to the optical path space and operates said supply/exhaust mechanism as an exhaust mechanism when a predetermined region of said stage starts to enter the optical path space, and operates said supply/exhaust mechanism as an air supply mechanism after a lapse of predetermined time.

18. The apparatus according to claim 2, wherein said gas flow formation mechanism comprises
a plurality of flow rate controllers, and
a plurality of air supply ports respectively connected to said plurality of flow rate controllers, and
said plurality of flow rate controllers are arranged to form a nonuniform flow velocity distribution.

19. The apparatus according to claim 2, wherein said gas flow formation mechanism forms a nonuniform flow velocity distribution by a plurality of filters having different pressure losses.

20. The apparatus according to claim 1, further comprising a shielding portion which separates at least part of a side plane of the optical path space from an ambient space around the optical path space.

21. The apparatus according to claim 1, further comprising a shielding portion which separates a plane having no gas flow formation mechanism out of side planes of the optical path space from an ambient space around the optical path space.

22. The apparatus according to claim 2, wherein the nonuniform flow velocity distribution includes a distribution in which a flow velocity is higher at a periphery apart from an optical axis of said optical system.

23. The apparatus according to claim 22, wherein said gas flow formation mechanism comprises
a plurality of flow rate controllers, and
a plurality of air supply ports respectively connected to said plurality of flow rate controllers, and
said plurality of flow rate controllers are arranged to form a nonuniform flow velocity distribution.

24. The apparatus according to claim 22, wherein said gas flow formation mechanism comprises a plurality of air supply ports arranged to supply inert gas in a predetermined direction, and an outer air supply port out of the plurality of air supply ports projects in the predetermined direction.

25. The apparatus according to claim 22, wherein said gas flow formation mechanism comprises
- a supply mechanism which supplies inert gas to the optical path space, and
- an exhaust mechanism which exhausts gas containing inert gas from the optical path space, and
- said exhaust mechanism is arranged at a position opposite to said supply mechanism via the optical path space.

26. The apparatus according to claim 22, wherein said gas flow formation mechanism comprises two gas supply portions arranged at positions opposite to each other via the optical path space.

27. The apparatus according to claim 26, wherein said gas flow formation mechanism comprises two gas exhaust portions arranged at positions opposite to each other via the optical path space.

28. The apparatus according to claim 25, further comprising a wall arranged at a position opposite to said supply mechanism via a center of the optical path space with a surface of said wall facing to the center.

29. The apparatus according to claim 22, further comprising a shielding portion which separates at least part of a side plane of the optical path space from an ambient space around the optical path space.

30. The apparatus according to claim 22, further comprising a shielding portion which separates a plane having no gas flow formation mechanism out of side planes of the optical path space from an ambient space around the optical path space.

31. The apparatus according to claim 29, wherein said shielding portion is formed by a flow of inert gas.

32. The apparatus according to claim 1, wherein said gas flow formation mechanism supplies inert gas to the optical path space so as to adjust the optical path space to a positive pressure with respect to an ambient space.

33. The apparatus according to claim 21, wherein at least part of said shielding portion is formed from a member which transmits alignment light.

34. The apparatus according to claim 1, further comprising:
- a substrate stage;
- a substrate chuck mounted on said substrate stage; and
- a member which smooths a change in level between a substrate chucked by said substrate chuck and an ambient portion.

35. The apparatus according to claim 20, wherein said shielding portion which surrounds the optical path space is arranged to partially change a length from an end of said shielding portion to the substrate.

36. The apparatus according to claim 1, wherein said gas flow formation mechanism is arranged to form a flow of inert gas in an optical path space between a projection optical system and the substrate.

37. The apparatus according to claim 1, wherein said gas flow formation mechanism is arranged to form a flow of inert gas in an optical path space between an illumination system which illuminates the mask and a mask stage which holds the mask.

38. The apparatus according to claim 1, wherein said gas flow formation mechanism is arranged to form a flow of inert gas in an optical path space between a mask stage which holds the mask and a projection optical system.

39. The apparatus according to claim 1, wherein said gas flow formation mechanism comprises
- a first gas flow formation mechanism arranged to form a flow of inert gas in a first optical path space between a projection optical system and the substrate,
- a second gas flow formation mechanism arranged to form a flow of inert gas in a second optical path space between an illumination system which illuminates the mask and a mask stage which holds the mask, and
- a third gas flow formation mechanism arranged to form a flow of inert gas in a third optical path space between the mask stage and the projection optical system.

40. The apparatus according to claim 1, wherein the inert gas includes nitrogen gas or helium gas.

41. A device manufacturing method comprising the steps of:
- transferring a pattern to a substrate coated with a photosensitive material by using an exposure apparatus; and
- developing the substrate,
- wherein the exposure apparatus is arranged to project and transfer a pattern formed on the mask to the substrate by using exposure light,
- the exposure apparatus comprises
  - a stage,
  - an optical system, and
  - a gas flow formation mechanism which forms a flow of inert gas in an optical path space including a space through which exposure light passes between the stage and the optical system, and
- the gas flow formation mechanism forms a flow of inert gas having a spatially or temporally nonuniform distribution in the optical path space.

* * * * *